United States Patent
Baniecki et al.

(10) Patent No.: US 7,180,119 B2
(45) Date of Patent: Feb. 20, 2007

(54) CAPACITOR AND METHOD FOR FABRICATING THE SAME, AND SEMICONDUCTOR DEVICE AND METHOD FOR FABRICATING THE SAME

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 143 days.

(21) Appl. No.: 10/849,791

(22) Filed: May 21, 2004

(65) Prior Publication Data

US 2005/0098816 A1 May 12, 2005

(30) Foreign Application Priority Data

Nov. 6, 2003 (JP) .............................. 2003-376665

(51) Int. Cl.
*H01L 27/108* (2006.01)
(52) U.S. Cl. ...................... 257/306; 257/295
(58) Field of Classification Search ................ 257/295, 257/306

See application file for complete search history.

(56) References Cited

U.S. PATENT DOCUMENTS 5,585,300 A 12/1996 Summerfelt
5,798,903 A 8/1998 Dhote et al.
2002/0117700 A1* 8/2002 Fox ............................ 257/295

FOREIGN PATENT DOCUMENTS

JP 8-116032 5/1996
JP 2000-509200 7/2000

* cited by examiner

*Primary Examiner*—Doug Menz
(74) *Attorney, Agent, or Firm*—Westerman, Hattori, Daniels & Adrian, LLP.

(57) ABSTRACT

The capacitor according to the present invention comprises a lower electrode 18 formed on a base substrate 14, a dielectric film 20 formed on the lower electrode 18, and an upper electrode 28 formed on the dielectric film 20 and including a polycrystalline conduction film 22, and a amorphous conduction film 24 formed on the polycrystalline conduction film 22. Because of the amorphous conduction film 24 included in the upper electrode 28, which can shut off hydrogen and water, hydrogen and water can be prohibited from arriving at the dielectric film 20. Accordingly, the dielectric film 20 of an oxide is prevented from being reduced with hydrogen, and the capacitor can have good electric characteristics.

22 Claims, 24 Drawing Sheets

US 7,180,119 B2

CAPACITOR AND METHOD FOR FABRICATING THE SAME, AND SEMICONDUCTOR DEVICE AND METHOD FOR FABRICATING THE SAME

CROSS-REFERENCE TO RELATED APPLICATION

This application is based upon and claims priority of Japanese Patent Application No. 2003-376665, filed on Nov. 6, 2003, the contents being incorporated herein by reference.

BACKGROUND OF THE INVENTION

The present invention relates to a capacitor and a method for fabricating the capacitor, and a semiconductor device and a method for fabricating the semiconductor device, more specifically, a capacitor using a dielectric film of a high dielectric substance and a ferroelectric substance and a method for fabricating the capacitor, and a semiconductor device and a method for fabricating the semiconductor device.

Near an LSI (Large Scale Integrated circuit) or others mounted on a printed circuit board, decoupling capacitors are mounted for the prevention of erroneous operations due to source voltage changes and high-frequency noises.

The decoupling capacitor is formed on a support board different from the printed circuit board and are suitable mounted on the printed circuit board.

Recently, as higher speed and lower electric power consumption of LSIs, the characteristics of the decoupling capacitors are required to be improved. As LSIs, etc. are down-sized, the decoupling capacitors are also required to be down-sized.

Then, techniques of increasing the capacitance while satisfying the requirement of down-sizing the decoupling capacitors are proposed.

FIGS. 24A and 24B are a sectional view of the proposed decoupling capacitor.

As shown in FIGS. 24A and 24B, a lower electrode 118 of, e.g., Pt is formed on a base substrate 110.

A dielectric film 120 of BST ((Ba, Sr) TiO$_3$), which is a dielectric substance, is formed on the lower electrode 118. The film thickness of the dielectric film 120 is, e.g., 200 nm.

An upper electrode 120 of, e.g., Pt is formed on the dielectric film 120.

The lower electrode 118, the dielectric film 120 and the upper electrode 128 constitute a capacitor 130.

A protection film 132 of polyimide is formed on the base substrate 110 with the capacitor 130 formed on.

An opening 134*a* and an opening 134*b* are formed in the protection film 132 respectively down to the upper electrode 128 and the lower electrode 118.

Vias 136*a*, 136 are formed respectively in the openings 134*a*, 134*b*.

Solder bumps 138*a*, 138*b* are formed on the vias 136*a*, 136*b*.

The upper electrode 128 of the capacitor 130 is electrically connected to the power source line of, e.g., a printed circuit board (not sown) via the via 134*a*, the solder bump 138*a*, etc.

The lower electrode 118 of the capacitor 130 is electrically connected to the earth wire of, e.g., the printed circuit board (not shown) via the via 134*b*, the solder bump 138*b*, etc.

Thus, the proposed decoupling capacitor is constituted.

The decoupling capacitor shown in FIGS. 24A and 24B uses a high dielectric substance as the material of the dielectric film 120, and besides, the dielectric film 120 is formed thin, whereby the capacitance can be increased while the requirement of down-sizing is satisfied.

Following references disclose the background art of the present invention.

[Patent Reference 1]
Specification of Japanese Patent Application Unexamined Publication No. Hei 8-116032

[Patent Reference 2]
Specification of Japanese Patent Application Unexamined Publication No. 2000-509200

SUMMARY OF THE INVENTION

An object of the present invention is to provide a capacitor having good electric characteristics and a method for fabricating the capacitor, and a semiconductor device using the capacitor and a method for fabricating the semiconductor device.

According to one aspect of the present invention, there is provided a capacitor comprising: a lower electrode formed on a base substrate; a dielectric film formed on the lower electrode; an upper electrode formed on the dielectric film and including a polycrystalline conduction film and an amorphous conduction film formed on the polycrystalline conduction film.

According to another aspect of the present invention, there is provided a semiconductor device comprising a capacitor formed on a semiconductor substrate, the capacitor including a lower electrode; a dielectric film formed on the lower electrode; and an upper electrode including a polycrystalline conduction film formed on the dielectric film and a no-crystalline conduction film formed on the polycrystalline conduction film.

According to further another aspect of the present invention, there is provided a method for fabricating a capacitor comprising the steps of: forming a lower electrode on a base substrate; forming a dielectric film on the lower electrode; and forming on the dielectric film an upper electrode including a polycrystalline conduction film, and an amorphous conduction film formed on the polycrystalline conduction film.

According to further another aspect of the present invention, there is provided a semiconductor fabricating method comprising the step of forming a capacitor on a semiconductor substrate, the step of forming a capacitor comprising the step of forming a lower electrode on the semiconductor substrate; the step of forming a dielectric film on the lower electrode; and the step of sequentially forming on the dielectric film a polycrystalline conduction film and an amorphous conduction film.

Because of the amorphous conduction film included in the upper electrode, which can shut off hydrogen and water, hydrogen and water can be prohibited from arriving at the dielectric film. Accordingly, the dielectric film of an oxide is prevented from being reduced with hydrogen, and the capacitor can have good electric characteristics.

According to the present invention, the side of the dielectric film is covered by the amorphous insulation film, whereby the side of the dielectric film is prevented from being reduced with hydrogen. The capacitor according to the present invention can have good electric characteristics.

According to the present invention, the upper electrode include the amorphous conduction film, whereby hydrogen and water are prohibited from passing through the upper electrode and arriving at the dielectric film. Thus, the semiconductor device according to the present invention can prevent the dielectric film of an oxide from being reduced with hydrogen and accordingly can include the capacitor having good electric characteristics.

DETAILED DESCRIPTION OF THE INVENTION

Figure 24A:
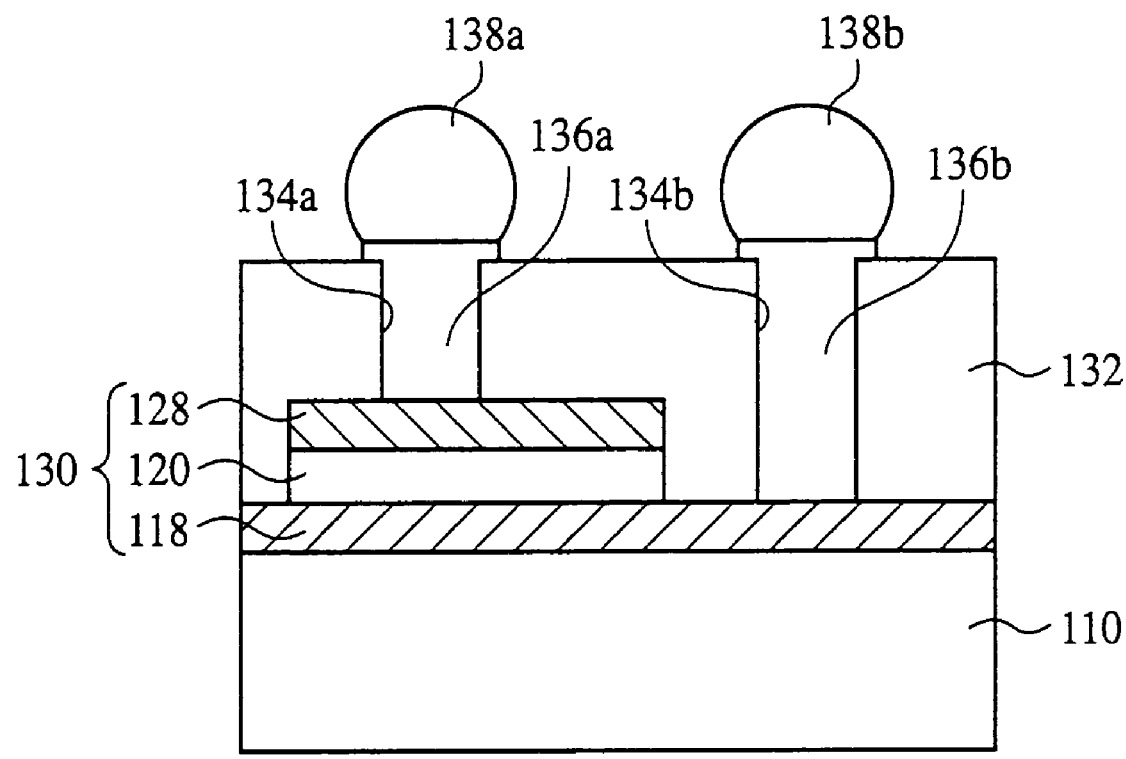
FIGS. 24A and 24B are sectional views of the proposed semiconductor device.
Figure 24B:
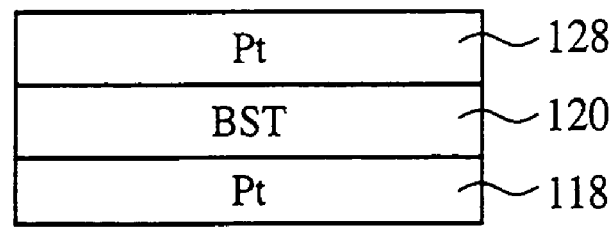

In the proposed decoupling capacitor shown in FIGS. 24A and 24B, hydrogen and water (steam) pass through the upper electrode 128 and arrives at the dielectric film 120. That is, in the processing following the formation of the upper electrode 128, when the upper electrode 128 is exposed to an atmosphere containing hydrogen or an atmosphere containing water, the hydrogen or the water pass through the upper electrode 128 and arrive at the dielectric film 120. The water contained in the resin film (as of, e.g., polyimide, epoxy or others) forming the protection film 132 pass through the upper electrode 128 and arrive at the dielectric film 120. When the hydrogen and water arrives at the dielectric film 120, the metal oxide forming the dielectric film 120 is reduced with the hydrogen, and the electric characteristics of the dielectric film 120 are deteriorated. Thus, the proposed decoupling capacitor has failed to good electric characteristics.

[A First Embodiment]

Figure 1A:
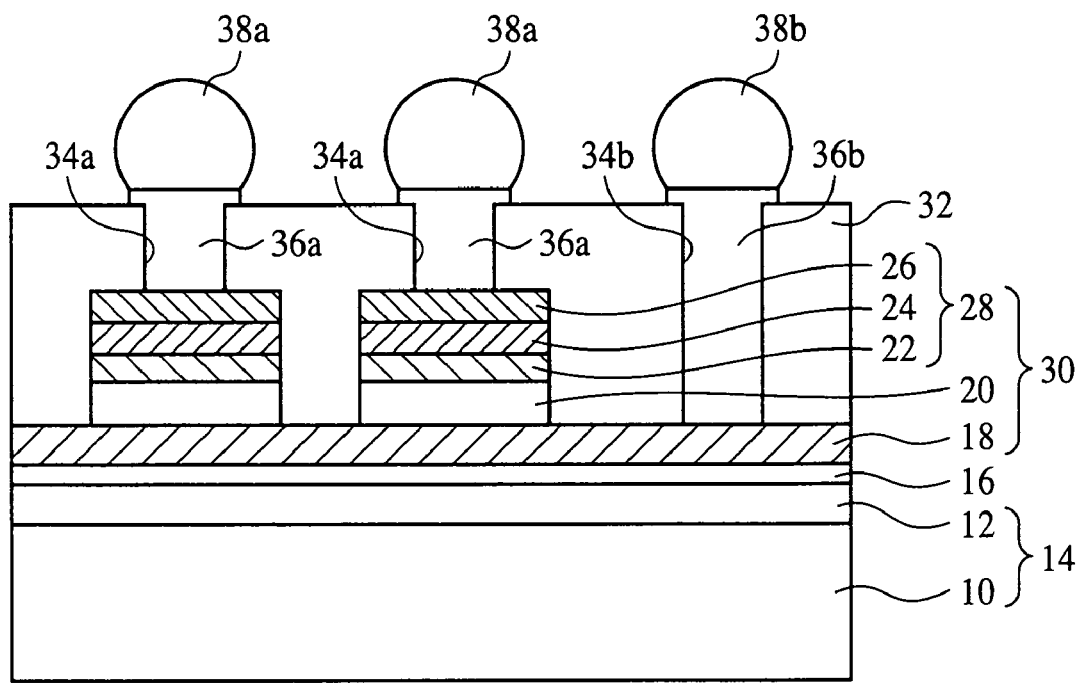
FIGS. 1A and 1B are sectional views of the capacitor according to a first embodiment of the present invention.

The capacitor according to a first embodiment of the present invention and a method for fabricating the capacitor will be explained with reference to FIGS. 1A to 6. FIG. 1 is sectional views of the capacitor according to the present embodiment.

The present embodiment will be explained by means of a decoupling capacitor, but the principle of the present invention is applicable not only to decoupling capacitors, but also any capacitor.

(A Capacitor)

Figure 1B:
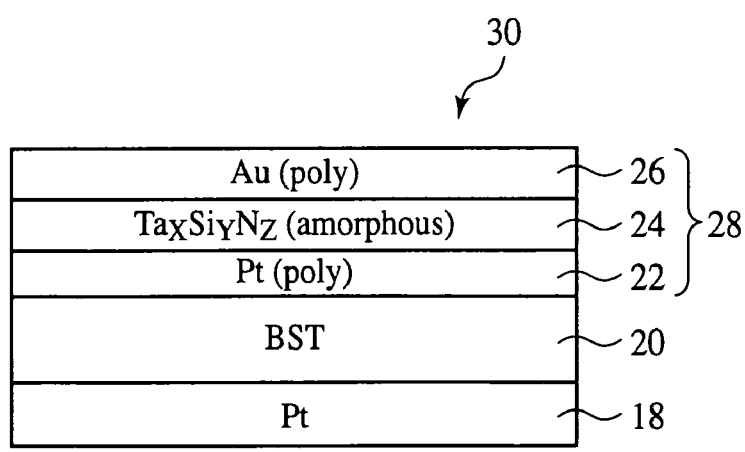

The capacitor according to the present embodiment will be explained with reference to FIGS. 1A and 1B. FIG. 1A is a sectional view of the capacitor according to the present embodiment, which illustrates a structure thereof. FIG. 1B is a conceptual views of the capacitor portion of the capacitor according to the present embodiment.

As shown in FIGS. 1A and 1B, an insulation film 12 is formed on a semiconductor substrate 10. The semiconductor substrate 10 is, e.g., a silicon substrate. The insulation film 12 is, e.g., silicon oxide film. The semiconductor substrate 10 and in the insulation film 12 form a base substrate 14.

When the substrate 10 is an insulating substrate, the insulation film 12 may not be formed on the substrate 10.

An adhesion layer 16 is formed on the base substrate 14. The adhesion layer 16 is, e.g., a $TiO_2$ layer. The adhesion layer 16 is for ensuring the adhesion between a lower electrode 18 and the base substrate 14.

The lower electrode 18 is formed on the adhesion layer 16. The lower electrode 18 is formed of, e.g., a Pt film.

A dielectric film 20 is formed on the lower electrode 18. The dielectric film 20 is formed of a high dielectric film and a ferroelectric film. The high dielectric film is a dielectric film whose relative dielectric constant is higher than that of silicon oxide film. The ferroelectric film is a dielectric film containing a crystal phase which has spontaneous polarization and the spontaneous polarization is reversed by external magnetic fields. The dielectric film 20 here is formed of BST film. The composition of the BST film is, e.g., $Ba_{0.7}Sr_{0.3}TiO_3$.

A polycrystalline conductor film (a first layer) 22 is formed on the dielectric film 20. The polycrystalline conductor film 22 is, e.g., Pt film.

An amorphous conductor film (a second layer) 24 is formed on the polycrystalline conductor film 22. The amorphous conductor film 24 is, e.g., $Ta_xSi_yN_z$ film.

Another polycrystalline conductor film (a third layer) 26 is formed on the amorphous conductor film 24. Said another polycrystalline conductor film 26 is Au film.

The polycrystalline conductor film 22, the amorphous conductor film 24 and the polycrystalline conductor 26 form an upper electrode 28.

The upper electrode 28 is thus formed in the present embodiment for the following reason.

That is, polycrystalline films, which have gaps, i.e., grain boundaries, among the respective crystal grains, permit hydrogen or steam to easily pass through. Accordingly, when the upper electrode is formed of a polycrystalline film alone, the hydrogen or steam pass through the upper electrode and arrive at the dielectric film. When hydrogen or steam arrives at the dielectric film, the dielectric film of a metal oxide is reduced with the hydrogen and is deteriorated. The capacitor cannot have good electric characteristics.

However, amorphous films, which have no grain boundaries, does not permit hydrogen or water to easily pass through. Accordingly, the amorphous film functions as a barrier film for hindering the hydrogen and water from arriving at the dielectric film.

In the present embodiment, the upper electrode includes the amorphous film functioning as the barrier film, and the amorphous film can shut off the hydrogen and water. Accordingly, the hydrogen and water can be prohibited from arriving at the dielectric film, and the deterioration of the dielectric film can be prevented. The capacitor can have good electric characteristics.

Here, it may be an idea to form the amorphous conductor film 24 directly on the dielectric film 20. However, when the amorphous conductor film 24 is formed directly on the dielectric film 20, increase of the leak current, decrease of the capacitance, etc. are caused, and desired electric characteristics cannot be obtained. Accordingly, the amorphous conductor film 22 must be formed between the dielectric film 20 and the amorphous conductor film 24.

The polycrystalline conductor film 26 formed on the amorphous conductor film 24 is for ensuring good contact between the upper electrode 28 and the via 36a. When good contact can be ensured between the upper electrode 28 and the via 36a without forming the polycrystalline conductor film 26, the polycrystalline conductor film 26 may not be formed on the amorphous conductor film 24.

The lower electrode 18, the dielectric film 20 and the upper electrode 28 form a capacitor portion 30.

A protection film 32 is formed on the base substrate 14 with the capacitor portion 30 formed on. The protection film 32 is, e.g., a polyimide film.

An opening 34a and an opening 34b are opened in the protection film 32 respectively down to the upper electrode 28 and the lower electrode 18.

Vias 36a, 36b are formed in the openings 34a, 34b. The upper surfaces of the vias 36a, 36b are exposed beyond the surface of the protection film 32.

Solder bumps 38a, 38b are formed on the vias 36a, 36b.

The capacitor according to the present embodiment is thus constituted.

The capacitor according to the present embodiment is characterized mainly in that the upper electrode 28 includes the amorphous conductor film 24.

In the proposed capacitor, in which the upper electrode is formed of the polycrystalline conductor film alone, hydrogen or water pass through the upper electrode and arrive at the dielectric film. The hydrogen or water arriving at the dielectric film reduces the dielectric film of a metal oxide and deteriorates the dielectric film. Accordingly, the proposed capacitor cannot have good electric characteristics.

In contrast to this, in the present embodiment, the upper electrode 28 includes the amorphous conductor film 24, which can shut off hydrogen and water, the hydrogen and water are prohibited form arriving at the dielectric film 20. Thus, in the present embodiment, the dielectric film 20 of an oxide can be prevented from being reduced with the hydrogen, and the capacitor can have good electric characteristics.

(The Method for Fabricating the Capacitor)

Next, the method for fabricating the capacitor according to the present embodiment will be explained with reference to FIGS. 2A to 6. FIGS. 2A to 6 are sectional views of the capacitor according to the present embodiment in the steps of the method for fabricating the capacitor, which illustrate the method.

Figure 2A:
FIGS. 2A to 2D are sectional views of the capacitor according to the first embodiment of the present invention in the steps of the method for fabricating the capacitor, which illustrate the method (Part 1).

First, as shown in FIG. 2A, the semiconductor substrate 10 is prepared. The semiconductor substrate 10 is, e.g., a silicon substrate.

Figure 2B:
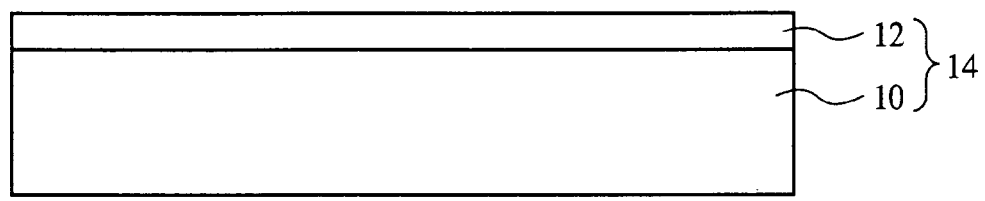

Then, as shown in FIG. 2B, the insulation film 12 is formed on the semiconductor substrate 10. As the insulation film 12, a silicon oxide film, for example, is formed. The silicon oxide film can be formed by, e.g., thermal oxidation. The film thickness of the insulation film 12 is, e.g., 500 nm. The semiconductor substrate 10 and the insulation film 12 forms the base substrate 14.

Figure 2C:
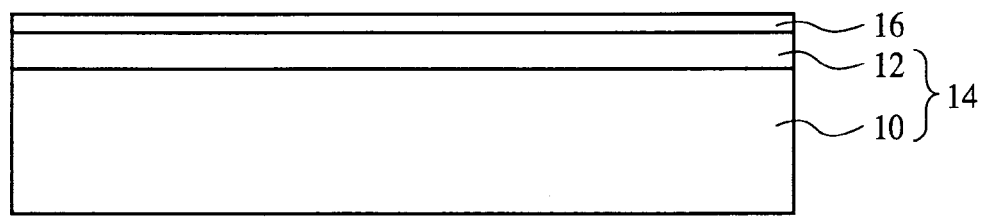

Then, as shown in FIG. 2C, the adhesion layer 16 is formed on the entire surface of the base substrate 14 by, e.g., radio frequency magnetron sputtering. As the adhesion layer 16, a $TiO_2$ layer for example, is formed. The adhesion layer 16 is for ensuring the adhesion between the lower electrode 18 and the base substrate 14. The thickness of the adhesion layer 16, e.g., about 10 nm.

Figure 2D:
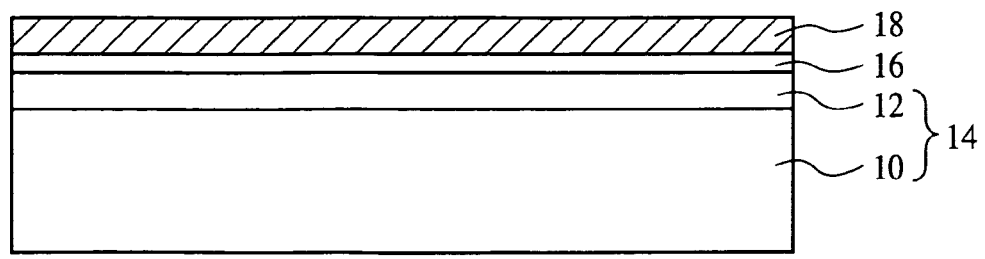

Then, as shown in FIG. 2D, the conduction film 18 is formed on the entire surface by, e.g., radio frequency magnetron sputtering. The conduction film 18 is for forming the lower electrode. As the conduction film 18, a Pt film, for example, is formed. The film thickness of the conduction film 18 is, e.g., about 100 nm.

Next, the adhesion layer 16 and the conduction film 18 are patterned by photolithography. The adhesion layer 16 and the conduction film 18 are patterned by dry etching, e.g., argon ion milling. Thus, the lower electrode 18 is formed of the conduction film.

Figure 3A:
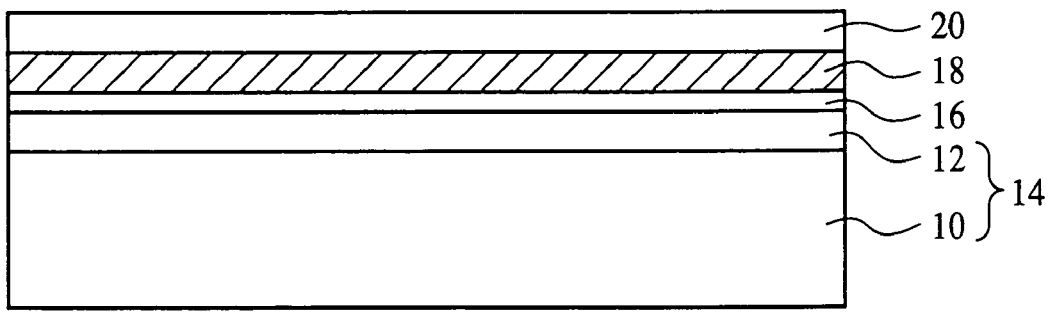
FIGS. 3A to 3C are sectional views of the capacitor according to the first embodiment of the present invention in the steps of the method for fabricating the capacitor, which illustrate the method (Part 2).
Figure 3B:
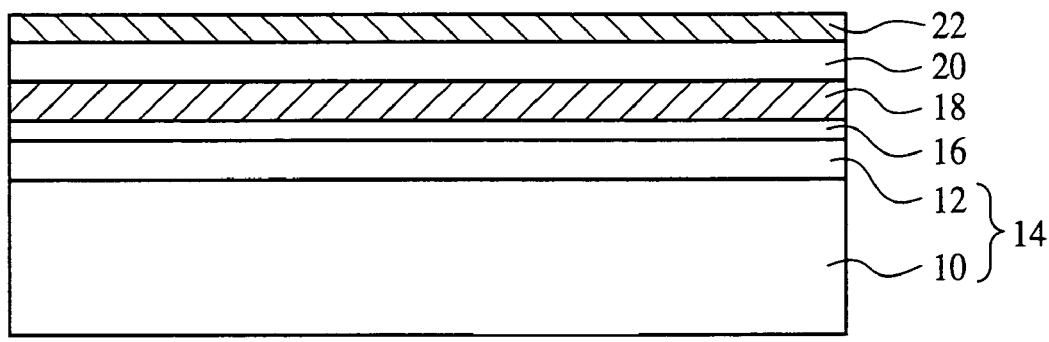

Then, as shown in FIG. 3A, the dielectric film 20 is formed on the entire surface. The dielectric film 20 can be formed by, sol-gel process, radio frequency magnetron sputtering, MOCVD (Metal Organic Chemical Vapor Deposition) or others. As the dielectric film 20, a high dielectric film or a ferroelectric film is formed. As the dielectric film 20 here, a BST film, for example, is formed. The film thickness of the dielectric film 20, e.g., about 100 nm.

Figure 3C:
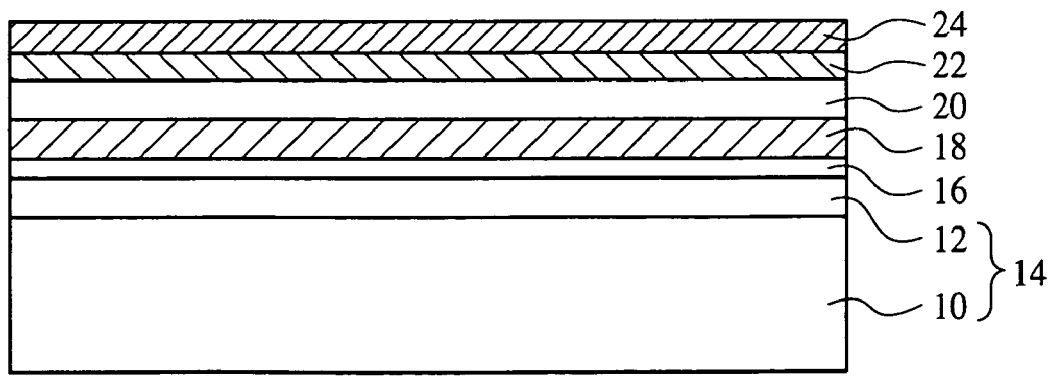

Then, as shown in FIG. 3C, the polycrystalline conduction film (a first layer) 22 is formed. The polycrystalline conduction film 22 is formed by, e.g., DC sputtering. As the polycrystalline conduction film 22, a Pt film, for example, is formed. The film thickness of the polycrystalline conduction film 22 is, e.g., about 100 nm.

Next, as shown in FIG. 3C, the amorphous conduction film (a second layer) 24 is formed. The amorphous conduction film 24 is formed by, e.g., radio frequency sputtering. As the amorphous conduction film 24, a $Ta_XSi_YN_Z$ film, for example, is formed. The film thickness of the amorphous conduction film 24 is, e.g., about 50 nm.

When a $Ta_XSi_YN_Z$ film as the amorphous conduction film 24 is formed, the $Ta_XSi_YN_Z$ film is formed, e.g., using a $TaSi_2$ target, in an $N_2$ atmosphere and by radio frequency sputtering. The flow rate ratio of the $N_2$ gas to be fed into the film forming chamber is suitably set to thereby control the composition of the $Ta_XSi_YN_Z$ film. For example, when the flow rate ratio of the $N_2$ gas is 30%, the composition of the $Ta_XSi_YN_Z$ film is about $Ta_{20}Si_{32}N_{47}$.

Figure 4A:
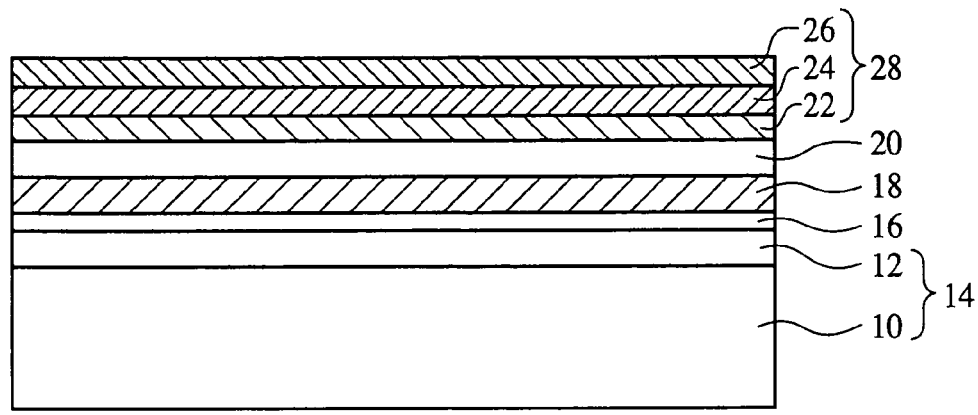
FIGS. 4A to 4C are sectional views of the capacitor according to the first embodiment of the present invention in the steps of the method for fabricating the capacitor, which illustrate the method (Part 3).

Then, as shown in FIG. 4A, the polycrystalline conduction film (a third layer) 26 is formed. The polycrystalline conduction film 26 is formed by, e.g., radio frequency sputtering. When the polycrystalline conduction film 26 is formed, it is preferable to form the amorphous conduction film 24 and then, without being exposed to the atmospheric air, continuously form the polycrystalline conduction film 26. The formation of the amorphous conduction film 24 is continuously followed by the formation of the polycrystalline conduction film 26 so as to prevent the interface between the amorphous conduction film 24 and the polycrystalline conduction film 26 from being contaminated. As the polycrystalline conduction film 26, an Au film, for example, is formed. The film thickness of the polycrystalline conduction film 26 is, e.g., about 100 nm.

Thus, the layer film 28 is formed of the polycrystalline conduction film 22, the amorphous conduction film 24 and the polycrystalline conduction film 26.

Figure 4B:
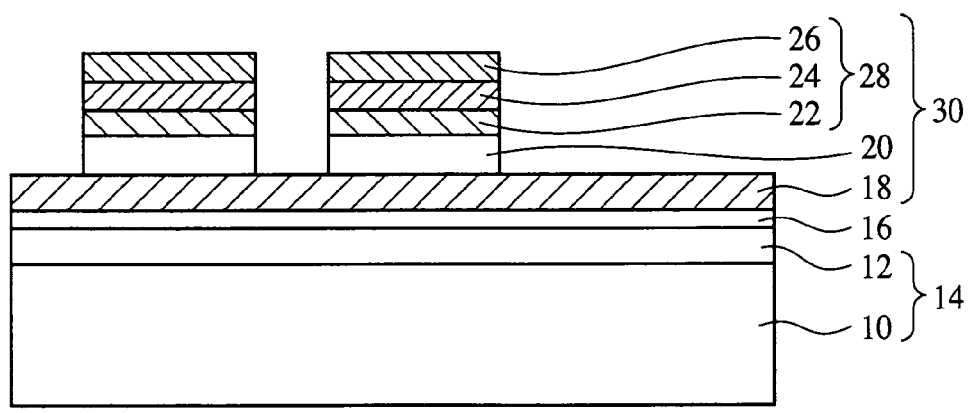

Then, as shown in FIG. 4B, the layer film 28 and the dielectric film 20 are patterned into a prescribed configuration by photolithography. The layer film 28 and the dielectric film 20 are patterned by, e.g., dry etching. The upper electrode 28 is thus formed of the layer film.

Figure 4C:
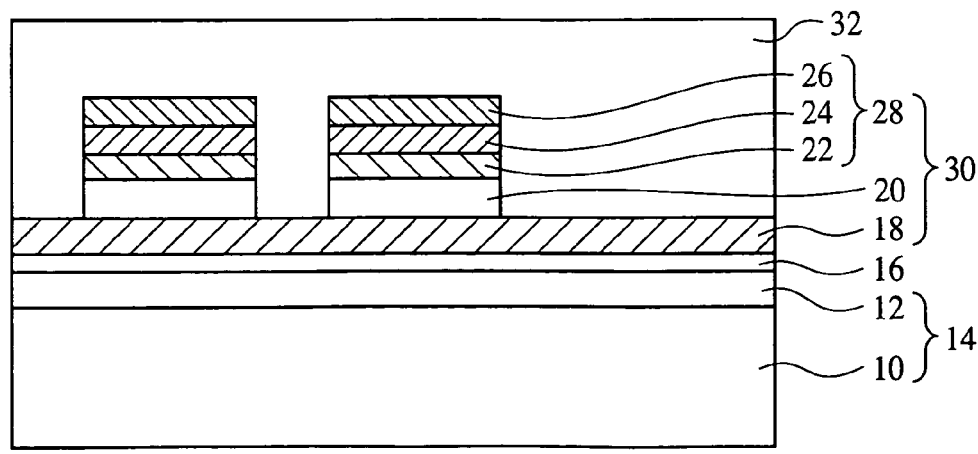

Then, as shown in FIG. 4C, the protection film 32 of polyimide is formed by, e.g., spin coating. The film thickness of the protection film 32 is, e.g., about 2 μm.

Figure 5A:
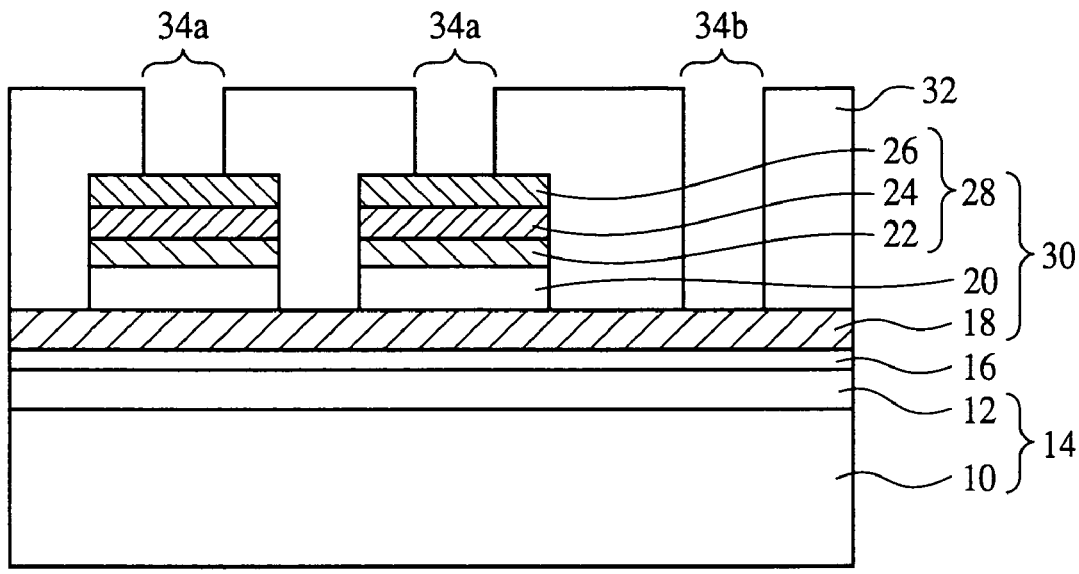
FIGS. 5A and 5B are sectional views of the capacitor according to the first embodiment of the present invention in the steps of the method for fabricating the capacitor, which illustrate the method (Part 4).
Figure 5B:
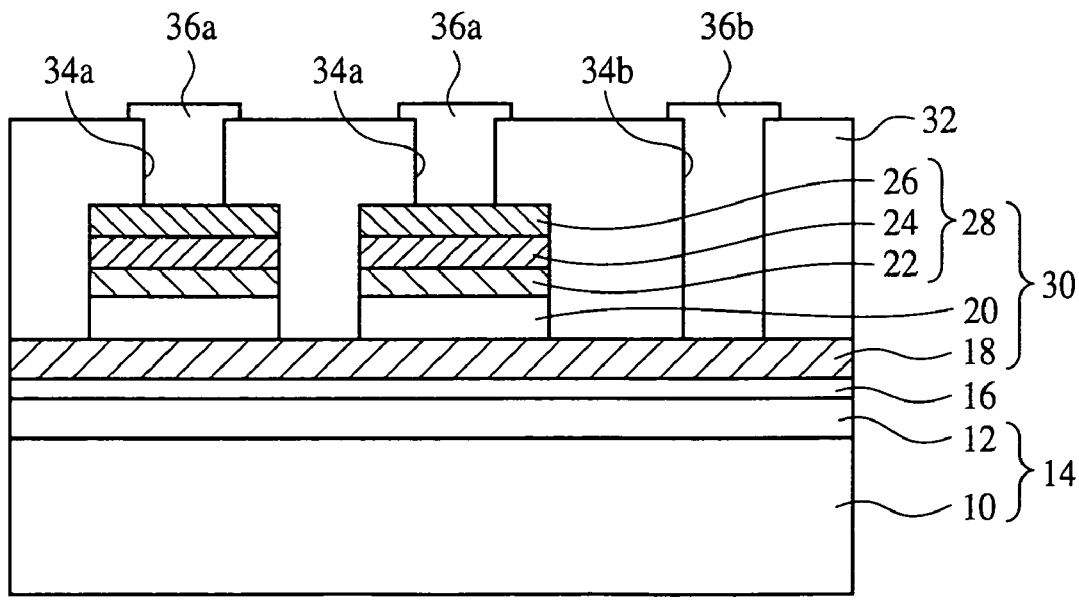

Next, as shown in FIG. 5A, the opening 34a and the opening 34b are formed in the protection film 32 respectively down to the upper electrode 28 and the lower electrode 18.

Next, the conduction film is formed on the entire surface by, e.g., sputtering. As the conduction film, an Ni/Cu/Ti film is formed. Then, that of the conduction film in the region other than the regions near the openings 34a, 34b is removed by photolithography and etching. The vias 36a, 36b are thus formed (see FIG. 5B).

Figure 6:
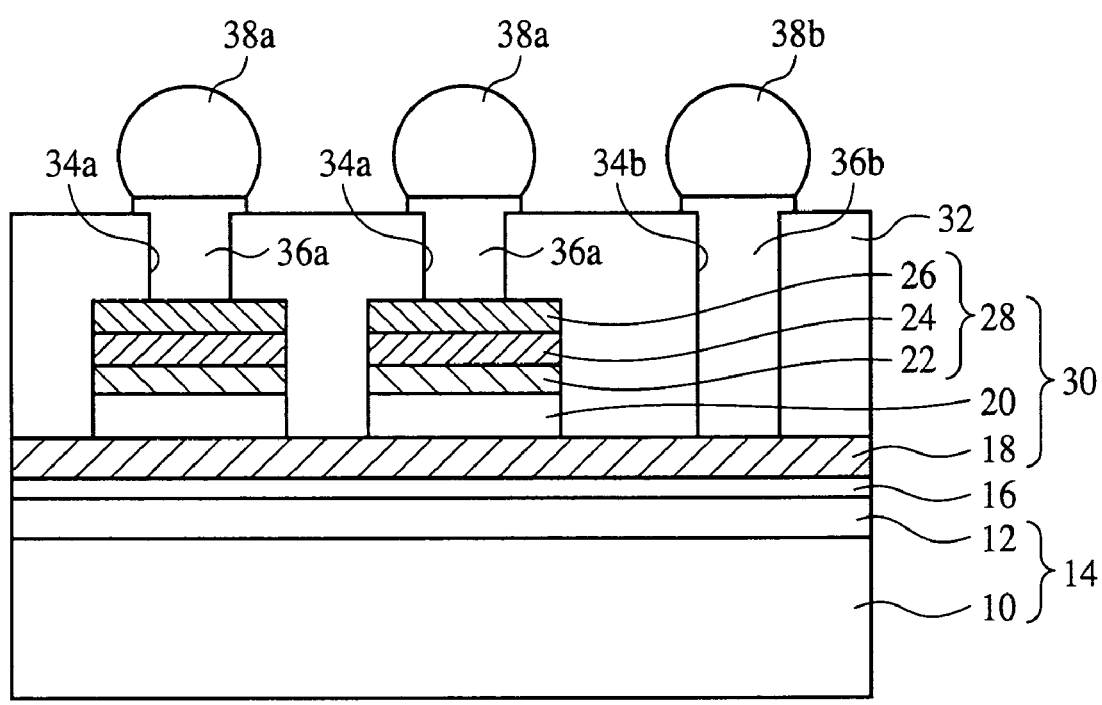
FIG. 6 is sectional views of the capacitor according to the first embodiment of the present invention in the steps of the method for fabricating the capacitor, which illustrate the method (Part 5).

Then, as shown in FIG. 6, the solder bumps 38a, 38b are formed respectively on the vias 36a, 36b by, e.g., plating.

Thus, the capacitor according to the present embodiment is fabricated.

(Modification 1)

Figure 7A:
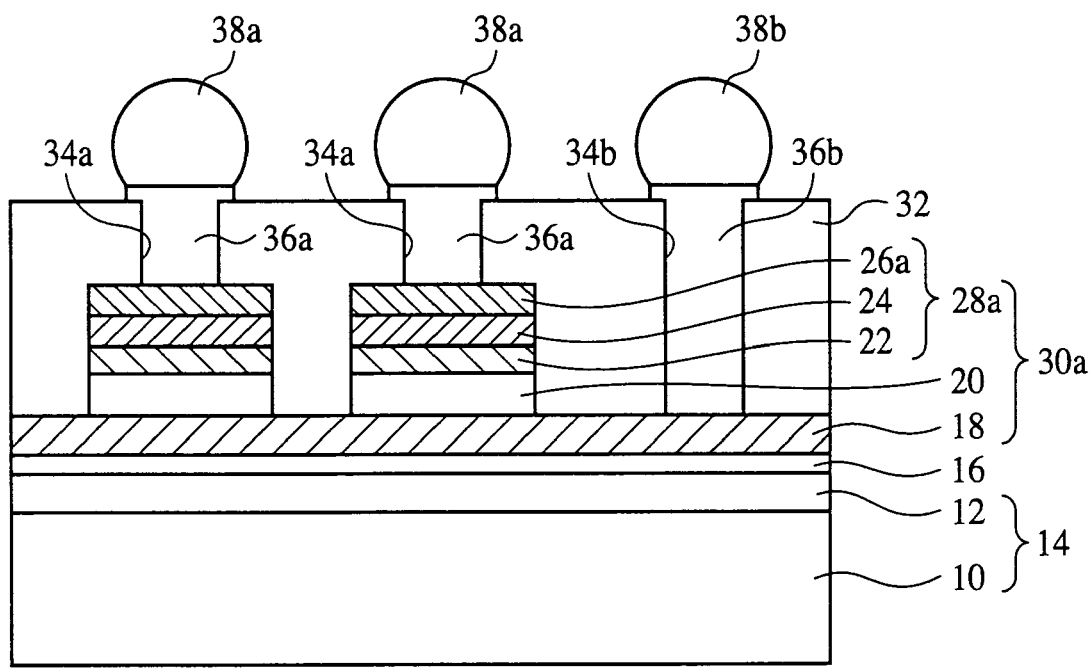
FIGS. 7A and 7B are sectional views of the capacitor according to Modification 1 of the first embodiment of the present invention.
Figure 7B:
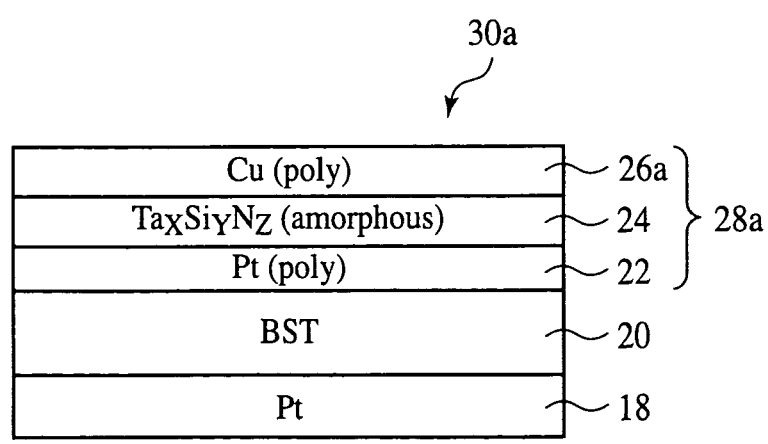

The capacitor according to one modification (Modification 1) of the present invention will be explained with reference to FIGS. 7A and 7B. FIGS. 7A and 7B are sectional views of the capacitor according to the present modification. FIG. 7A is a sectional view of the capacitor according to the present modification, which illustrates a structure thereof. FIG. 7B is a conceptual view of the capacitor portion of the capacitor according to the present modification.

The capacitor according to the present modification is characterized mainly in that a polycrystalline conduction film 26a on an amorphous conduction film 24 is formed of Cu film.

In the capacitor shown in FIGS. 1A and 1B, the polycrystalline conduction film 26 on the amorphous conduction film 24 is formed of Au film, but in the present modification, the polycrystalline conduction film 26a on the amorphous conduction film 24 is formed of Cu film. The thickness of the polycrystalline conduction film 26a is, e.g., about 100 nm. The polycrystalline conduction film 26a is formed by, e.g., DC sputtering. Preferably, the formation of the polycrystalline conduction film 22, the amorphous conduction film and the polycrystalline conduction film 26a is continuously performed without being exposed to the atmospheric air. The polycrystalline conduction film 22, the amorphous conduction film 24 and the polycrystalline conduction film 26a are continuously formed without being exposed to the atmospheric air, because the respective interface between the conduction films are prevented from being contaminated.

The polycrystalline conduction film 22, the amorphous conduction film 24 and the polycrystalline conduction film 26a form the upper electrode 28a.

The lower electrode 18, the dielectric film 20 and the upper electrode 28a form a capacitor portion 30a.

As described above, the capacitor according to the present modification is characterized mainly in that, as described above, Cu film is used as the polycrystalline conduction film 26a on the amorphous conduction film 24. Even when Cu film is used as the polycrystalline conduction film 26a on the amorphous conduction film 24, the capacitor can have good electric characteristics, as does the capacitor shown in FIGS. 1A and 1B.

(Modification 2)

Figure 8A:
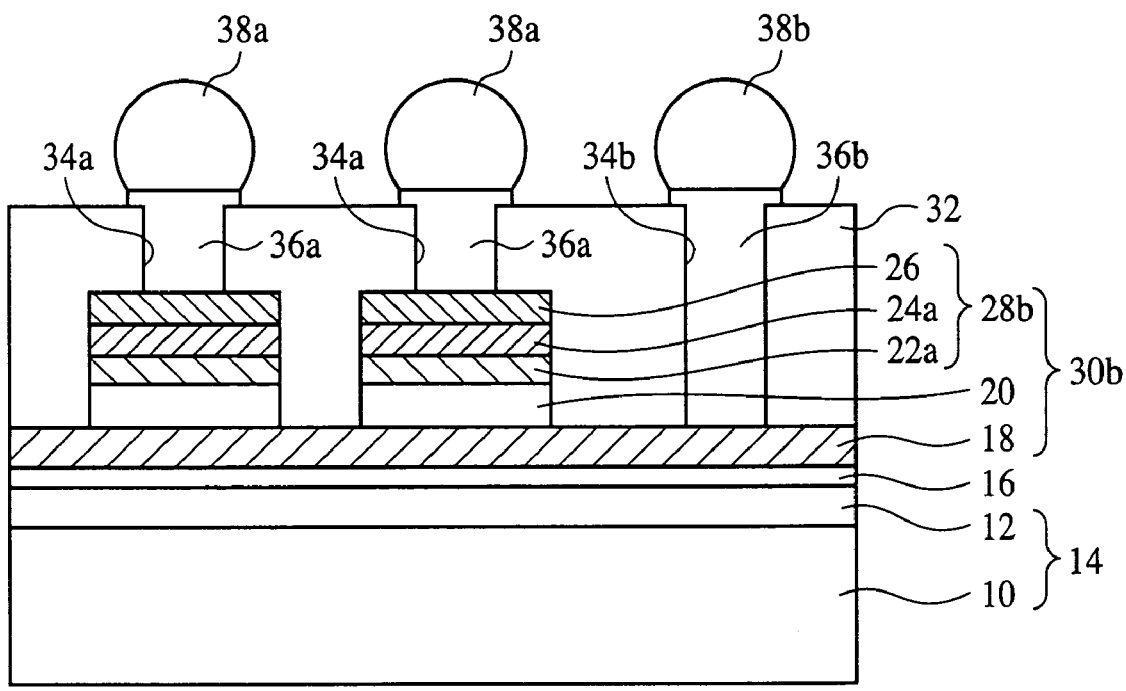
FIGS. 8A and 8B are sectional views of the capacitor according to Modification 2 of the first embodiment of the present invention.
Figure 8B:
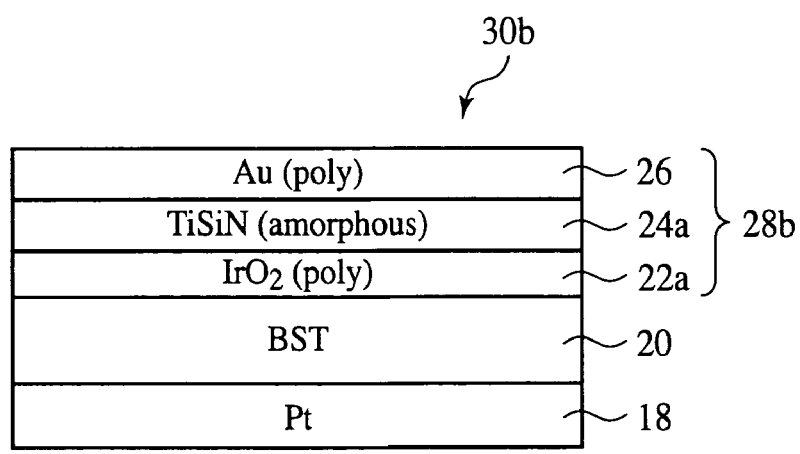

Then, the capacitor according to one modification (Modification 2) of the present embodiment will be explained with reference to FIGS. 8A and 8B. FIGS. 8A and 8B are sectional views of the capacitor according to the present modification. FIG. 8A is a sectional view of the capacitor according to the present modification. FIG. 8B is a conceptual view of a capacitor portion of the capacitor according to the present modification.

The capacitor according to the present modification is characterized mainly in that $IrO_2$ film is used as the polycrystalline conduction film (a first layer) 22a, and TiSiN film is used as the amorphous conduction film (a second layer) 24a, and Au film is used as the polycrystalline conduction film (a third layer) 26.

As shown in FIGS. 8A and 8B, the polycrystalline conduction film 22a is formed on the dielectric film 20. $IrO_2$ film is used as the polycrystalline conduction film 22a. The film thickness of the polycrystalline conduction film 22a is, e.g., about 100 nm. The polycrystalline conduction film 22a can be formed by, e.g., DC sputtering.

The amorphous conduction film 24a is formed on the polycrystalline conduction film 22a. TiSiN layer is used as the amorphous conduction film 24a. The composition of the TiSiN layer is, e.g., $Ti_1Si_1N_1$. The film thickness of the amorphous conduction film 24a is, e.g., about 50 nm. The amorphous conduction film 24 can be formed by, e.g., radio frequency sputtering.

The polycrystalline conduction film 26 is formed on the amorphous conduction film 24a. As the polycrystalline conduction film 26, Au film, for example, is used. The film thickness of the polycrystalline conduction film 26 is, e.g., about 100 nm. The polycrystalline conduction film 26 is formed by, e.g., DC sputtering. Preferably, the polycrystalline conduction film 22a, the amorphous conduction film 24a and the polycrystalline conduction film 26 are continuously formed without being exposed to the atmospheric air. This is for the prevention of the interfaces between the conduction films from contamination.

The polycrystalline conduction film 22a, the amorphous conduction film 24a and the polycrystalline conduction film 26 form the upper electrode 28.

The lower electrode 18, the dielectric film 20 and the upper electrode 28b form the capacitor portion 30b.

As described above, the capacitor according to the present modification is characterized in that, as described above, $IrO_2$ film is used as the polycrystalline conduction film 22a, and TiSiN film is used as the amorphous conduction film 24a. Even when $IrO_2$ film is used as the polycrystalline conduction film 22a, and TiSiN film is used as the amorphous conduction film 24a, the capacitor can have good electric characteristics, as does the capacitor shown in FIGS. 1A and 1B.

[A Second Embodiment]

Figure 9:
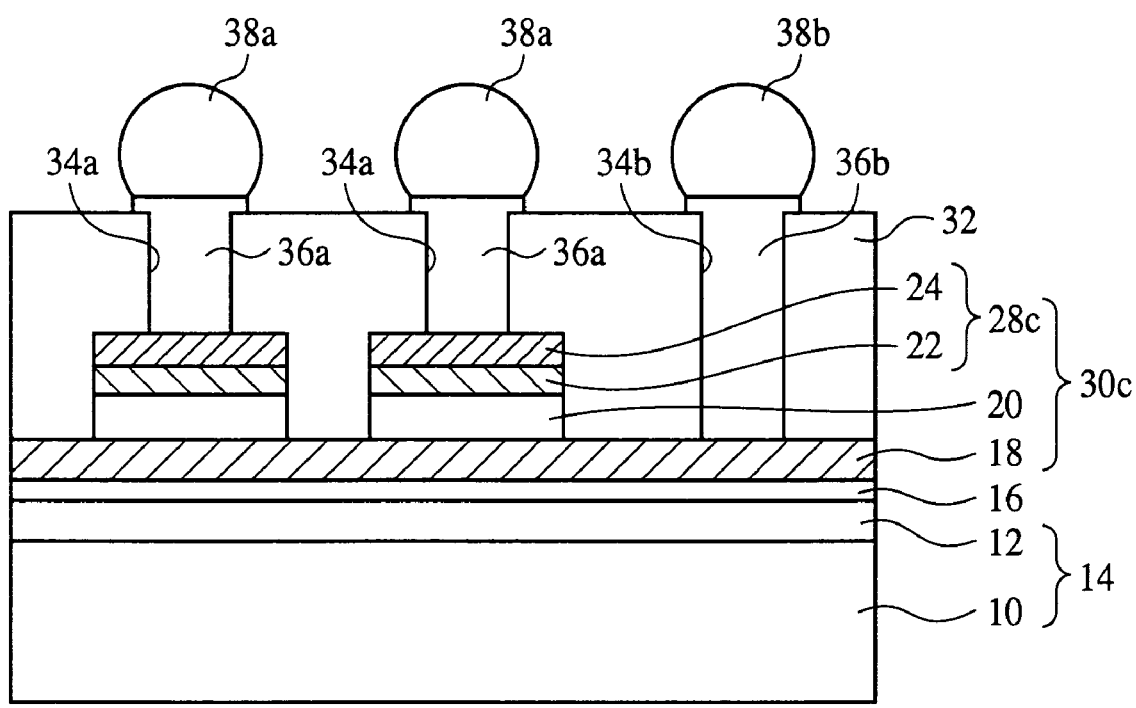
FIG. 9 is a sectional view of the capacitor according to a second embodiment of the present invention.

The capacitor according to a second embodiment of the present invention and the method for fabricating the capacitor will be explained with reference to FIGS. 9 to 12. FIG. 9 is a sectional view of the capacitor according to the present embodiment. The same members of the present embodiment as those of the capacitor according to the first embodiment and the method for fabricating the capacitor are represented by the same reference numbers not to repeat or to simplify their explanation.

(The Capacitor)

First, the capacitor according to the present embodiment will be explained with reference to FIG. 9.

The capacitor according to the present embodiment is characterized mainly in that an upper electrode 28c is formed of a polycrystalline conduction film 22 and an amorphous conduction film 24, and a via 36a is connected directly to a conduction film 24.

As shown in FIG. 9, a polycrystalline conduction film (a first layer) 22 is formed on a dielectric film 20. An amorphous conduction film (a second layer) 24 is formed on the polycrystalline conduction film 22. The polycrystalline conduction film 22 and the amorphous conduction film 24 form an upper electrode 28c.

The lower electrode 18, the dielectric film 20 and the upper electrode 28c form a capacitor portion 30c.

A protection film 32 is formed on the entire surface of a base substrate 14 with the capacitor portion 30c formed on.

Opening 34a and an opening 34b are formed in the protection film 32 respectively down to the upper electrode 24 and the lower electrode 18.

Vias 36a, 36b are formed in the openings 34a, 34b. The via 36a is connected directly to the amorphous conduction layer 24 of the upper electrode 28c. The vias 36a, 36b are formed of a material which can have good contact with the amorphous conduction film 24. The material of the vias 36a, 36b can be, e.g., Ni/Cu/Ti. The vias 36a, 36b have the upper surfaces exposed beyond the surface of the protection film 32.

Solder bumps 38a, 38b are formed on the vias 36a, 36b.

The capacitor according to the present embodiment is thus constituted.

As described above, the capacitor according to the present embodiment is characterized mainly in that, as described above, the upper electrode 28c is formed of the polycrystalline conduction film 22 and the amorphous conduction film 24, and the via 34a is connected directly to the amorphous conduction film 24. According to the present embodiment, the via 34a is formed of a material which provides good contact with the amorphous conduction film 24, whereby even with the via 34a directly connected to the amorphous conduction film 24, the capacitor can have good electric characteristics.

(The Method for Fabricating the Capacitor)

Then, the method for fabricating the capacitor according to the present embodiment will be explained with reference to FIGS. 10A to 12. FIGS. 10A to 12 are sectional views of the capacitor according to the present embodiment in the steps of the method for fabricating the capacitor, which illustrate the method.

The steps up to the step of forming the amorphous conduction film (a second layer) including the amorphous conduction film forming step are the same as those of the method for fabricating the capacitor according to the first embodiment, and their explanation will not be repeated (see FIGS. 2A to 3C).

Figure 10A:
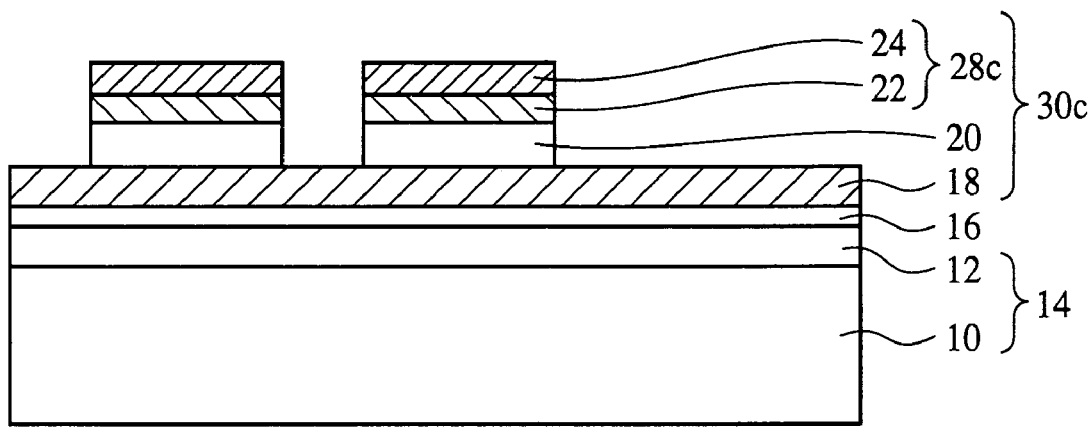
FIGS. 10A and 10B are sectional views of the capacitor according to the second embodiment of the present invention in the steps of the method for fabricating the capacitor, which illustrate the method (Part 1).

Then, as shown in FIG. 10A, the amorphous conduction film 24, the polycrystalline conduction film 22 and the dielectric film 20 are patterned into a prescribed configuration. The polycrystalline conduction film 22 and the amorphous conduction film 24 form the upper electrode 28c.

The lower electrode 18, the dielectric film 20 and the upper electrode 28c form the capacitor 30c.

Figure 10B:
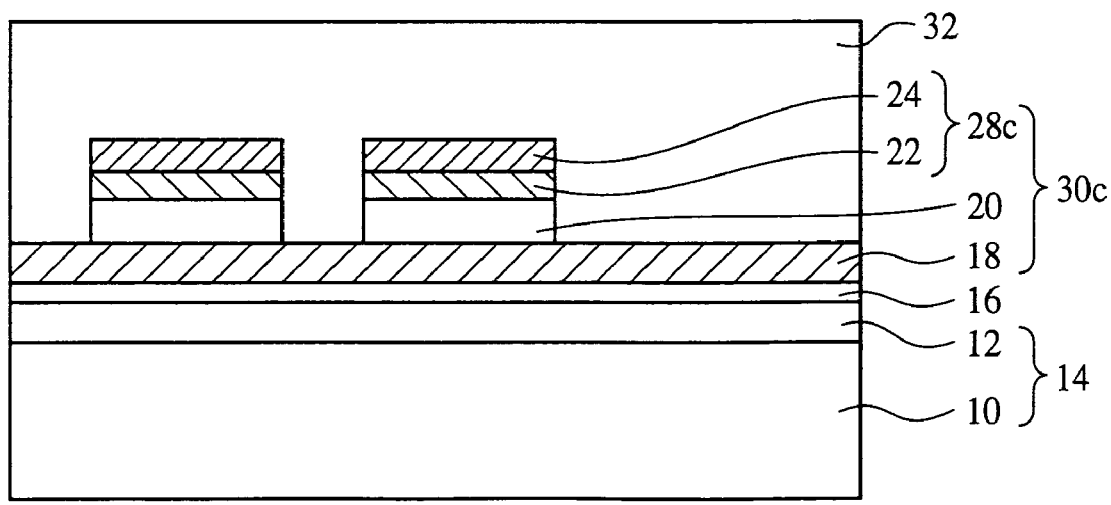

Then as shown in FIG. 10B, the protection film 32 is formed on the entire surface. The protection film 32 is formed in the same way as in the method for fabricating the capacitor, which has been explained with reference to FIG. 4C.

Then, openings 34a, 34b are formed in the protection film 32 respectively down to the upper electrode 28c and the lower electrode 18. The vias 34a, 34b are formed in the same way as in the method for fabricating the capacitor, which has been explained with reference to FIG. 5A.

Figure 11A:
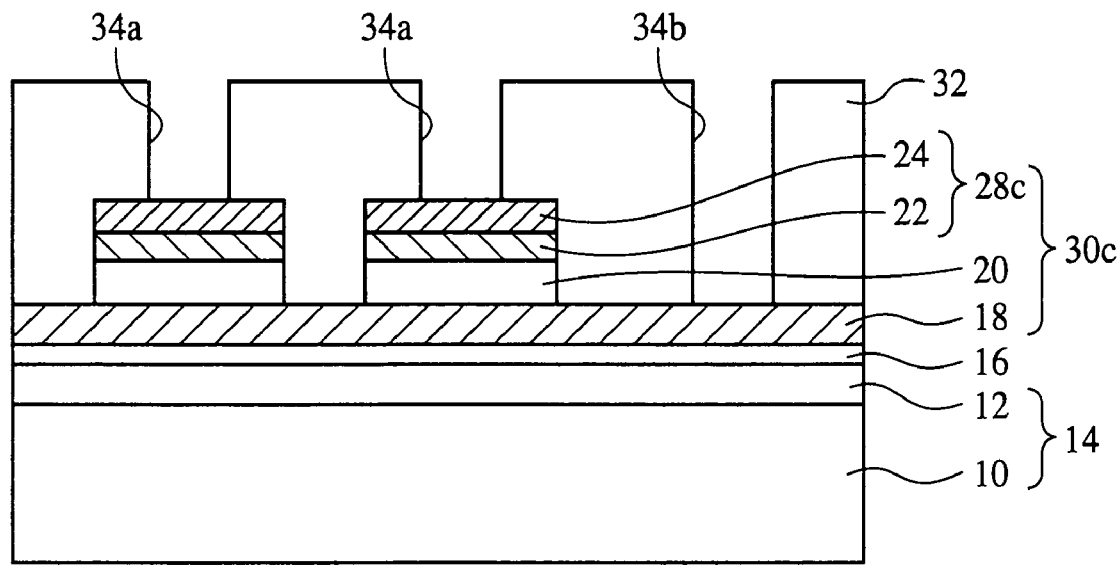
FIGS. 11A and 11B are sectional views of the capacitor according to the second embodiment of the present invention in the steps of the method for fabricating the capacitor, which illustrate the method (Part 2).
Figure 11B:
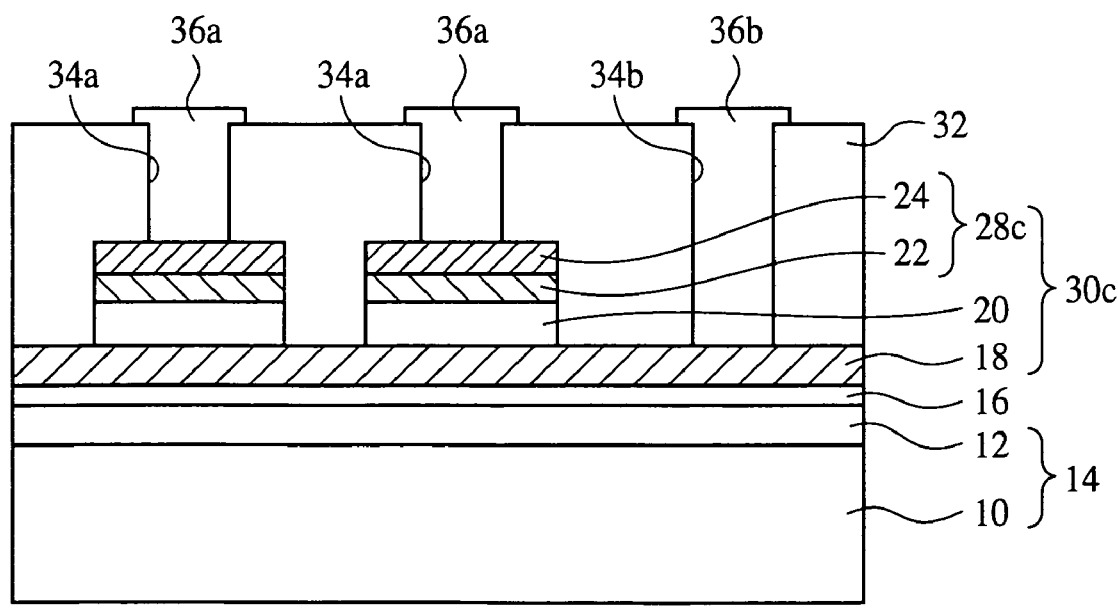
Figure 12:
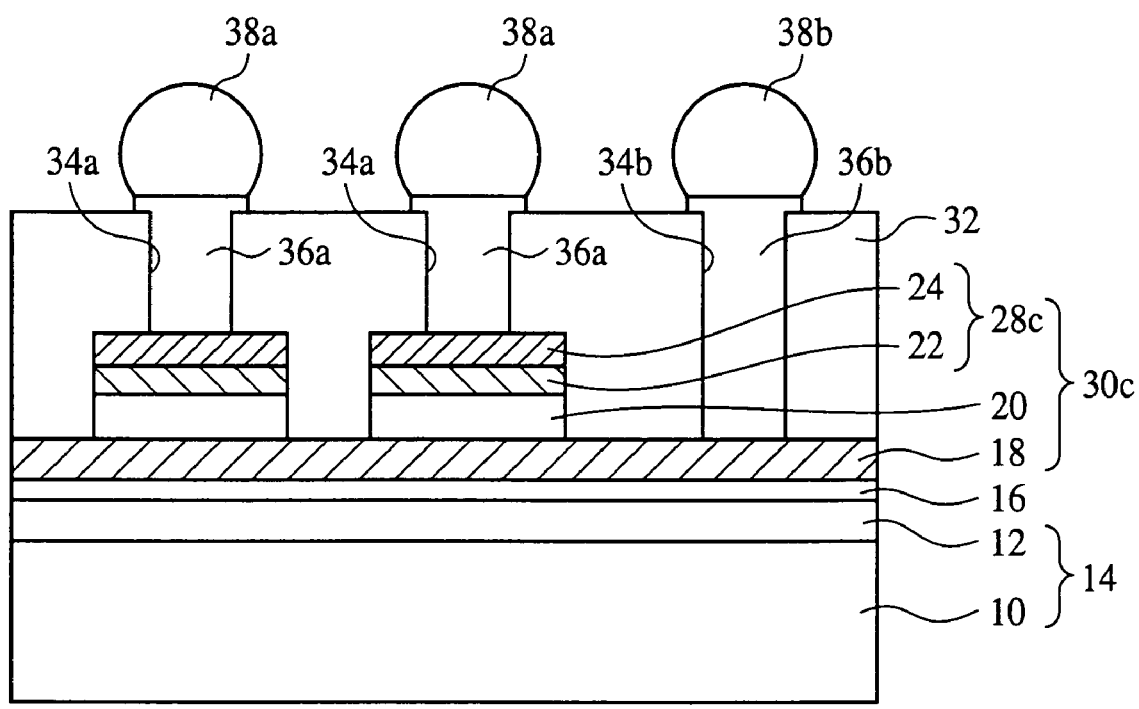
FIG. 12 is sectional views of the capacitor according to the third embodiment of the present invention in the steps of the method for fabricating the capacitor, which illustrate the method (Part 3).

The following steps of the method for fabricating the capacitor are the same as those of the method for fabricating the capacitor described above with reference to FIGS. 5B and 6, and their explanation will be omitted (see FIGS. 11B and 12).

The capacitor according to the present embodiment is thus fabricated.

[A Third Embodiment]

Figure 13:
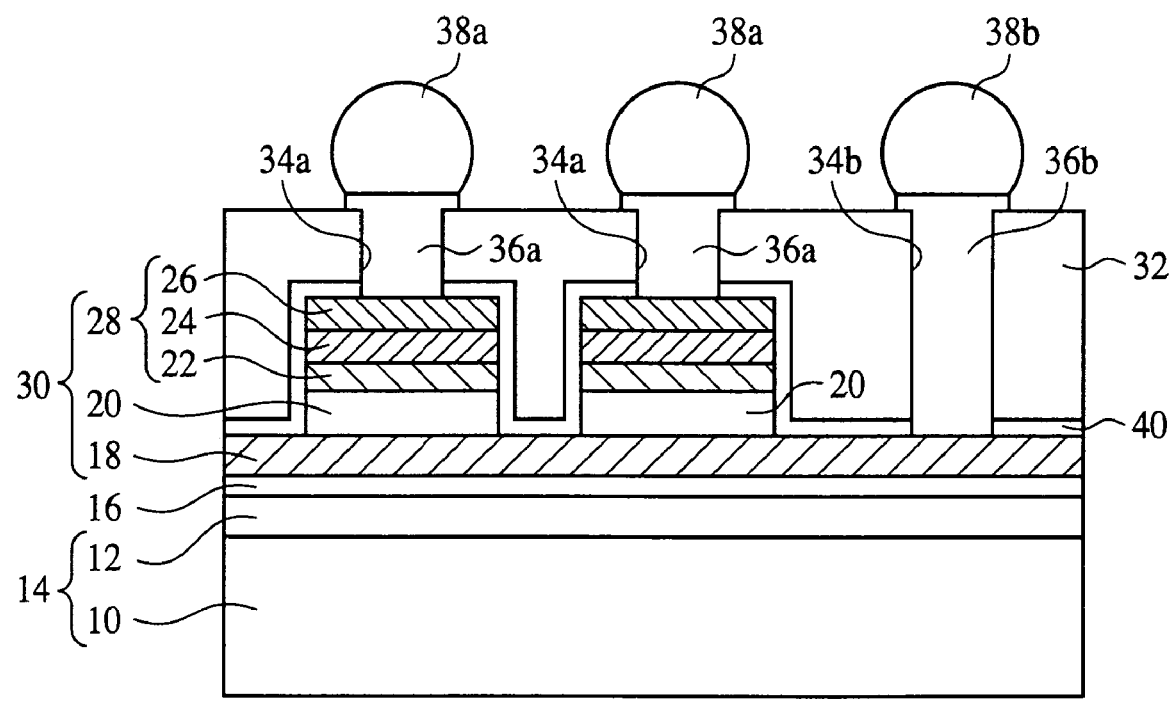
FIG. 13 is a sectional view of the capacitor according to a third embodiment of the present invention.

The capacitor according to a third embodiment of the present invention and the method for fabricating the capacitor will be explained with reference to FIGS. 13 to 16. FIG. 13 is a sectional view of the capacitor according to the present embodiment. The same members of the present embodiment as those of the capacitor according to the first or the second embodiment and the method for fabricating the capacitor are represented by the same reference numbers not to repeat or to simplify their explanation.

(The Capacitor)

First, the capacitor according to the present embodiment will be explained with reference to FIG. 13.

The capacitor according to the present embodiment is characterized mainly in that an amorphous insulation film 40 is formed, covering the capacitor portion 28.

As shown in FIG. 13, the amorphous insulation film 40 is formed, covering the capacitor portion 28. The amorphous insulation film 40 is for prohibiting hydrogen and water from arriving at the side of the dielectric film 20. The amorphous insulation film 40, which has no grain boundaries, can function as the barrier film for shutting off hydrogen and water. The side of the dielectric film 20, which is covered by the amorphous insulation film 40, can be prevented from being reduced with hydrogen. The amorphous insulation film 40 can be, e.g., alumina ($Al_2O_3$).

In the present embodiment, the amorphous insulation film 40 is alumina but is not essentially to alumina. For example, $Si_3N_4$ film or others may be used as the amorphous insulation film 40.

In the present embodiment, the amorphous insulation film 40 is formed, covering the whole capacitor portion 30 but may be formed, covering at least the side of the dielectric film 20.

It is an idea that the amorphous conduction film 24 is not formed, and hydrogen and water are shut off by the amorphous insulation film 40 alone. However, without the amorphous conduction film 24, hydrogen or water move through the via 36a, and the hydrogen or water cannot be prohibited form arriving at the dielectric film 20. Thus, it is not preferable not to form the amorphous conduction film 24.

A protection film 32 is formed on the amorphous insulation film 40.

Opening 34a and an opening 34b are formed in the protection film 32 and the amorphous insulation film 40 respectively down to the upper electrode 28 and the lower electrode 18.

Vias 36a, 36b are formed respectively in the openings 34a, 34b.

Solder bumps 38a, 38b are formed respectively on the vias 36a, 36b.

Thus, the capacitor according to the present embodiment are constituted.

The capacitor according to the present embodiment is characterized mainly in that, as described above, amorphous insulation film 40 is formed, covering the capacitor portion 28.

According to the present embodiment, the side of the dielectric film 20 is covered by the amorphous insulation film 40, whereby the side of the dielectric film 20 is prevented from being reduced with hydrogen. The capacitor according to the present embodiment can have good electric characteristics.

(The Method for Fabricating the Capacitor)

Next, the method for fabricating the capacitor according to the present embodiment will be explained with reference to FIGS. 14A to 16. FIGS. 14A to 16 are sectional views of the capacitor according to the present embodiment in the steps of the method for fabricating the capacitor, which illustrate the method.

The steps up to the step of patterning the layer film 28 and the ferroelectric film 20 including the patterning the layer film 28 and the ferroelectric film 20 are the same as in the method for fabricating the capacitor described above with reference to FIGS. 2A to 4B, and their explanation will not be repeated.

Figure 14A:
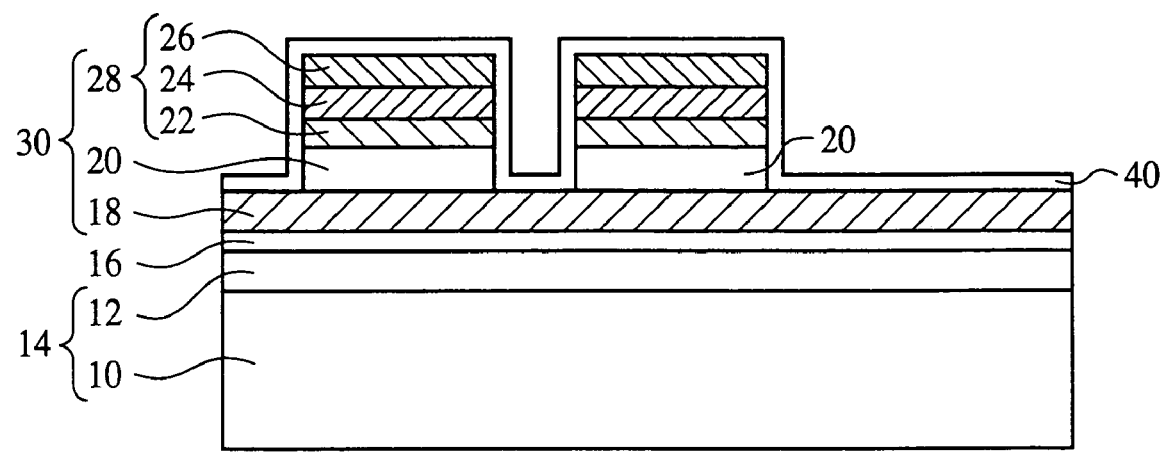
FIGS. 14A and 14B are sectional views of the capacitor according to the third embodiment of the present invention in the steps of the method for fabricating the capacitor, which illustrate the method (Part 1).

Then, as shown in FIG. 14A, the amorphous insulation film 40 is formed on the entire surface. The amorphous insulation film 40 can be, e.g., alumina ($Al_2O_3$). The amorphous insulation film 40 can be formed by, e.g., sputtering. The film thickness of the amorphous insulation film 40 is, e.g., about 50 nm.

Figure 14B:
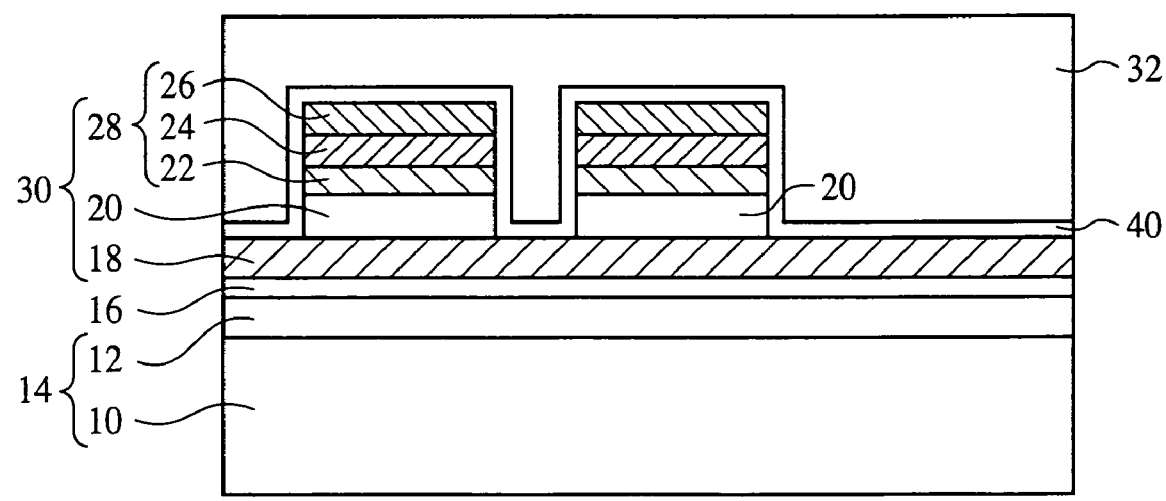

Then, as shown in FIG. 14B, the protection film 32 of polyimide is formed on the entire surface by, e.g., spin coating. The protection film 32 is formed in, e.g., the same way as in the method for fabricating the capacitor, which has been described above with reference to FIG. 4C.

Figure 15A:
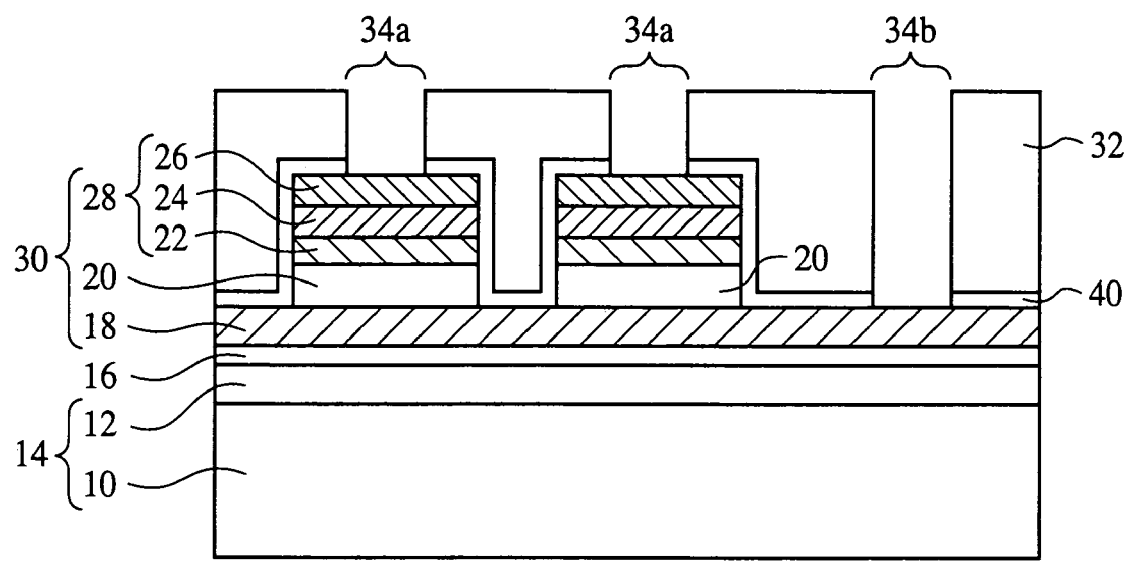
FIGS. 15A and 15B are sectional views of the capacitor according to the third embodiment of the present invention in the steps of the method for fabricating the capacitor, which illustrate the method (Part 2).

Then, as shown in FIG. 15A, the opening 34a and the opening 34b are formed by photolithography in the protection film 32 and the amorphous insulation film 40 respectively down to the upper electrode 28 and the lower electrode 18.

Figure 15B:
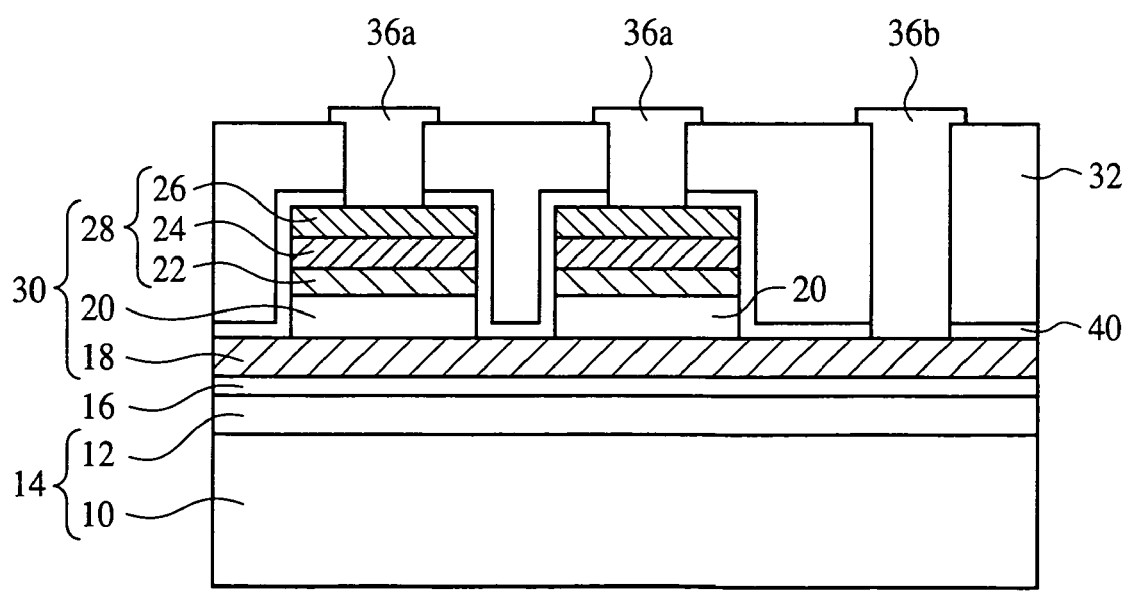
Figure 16:
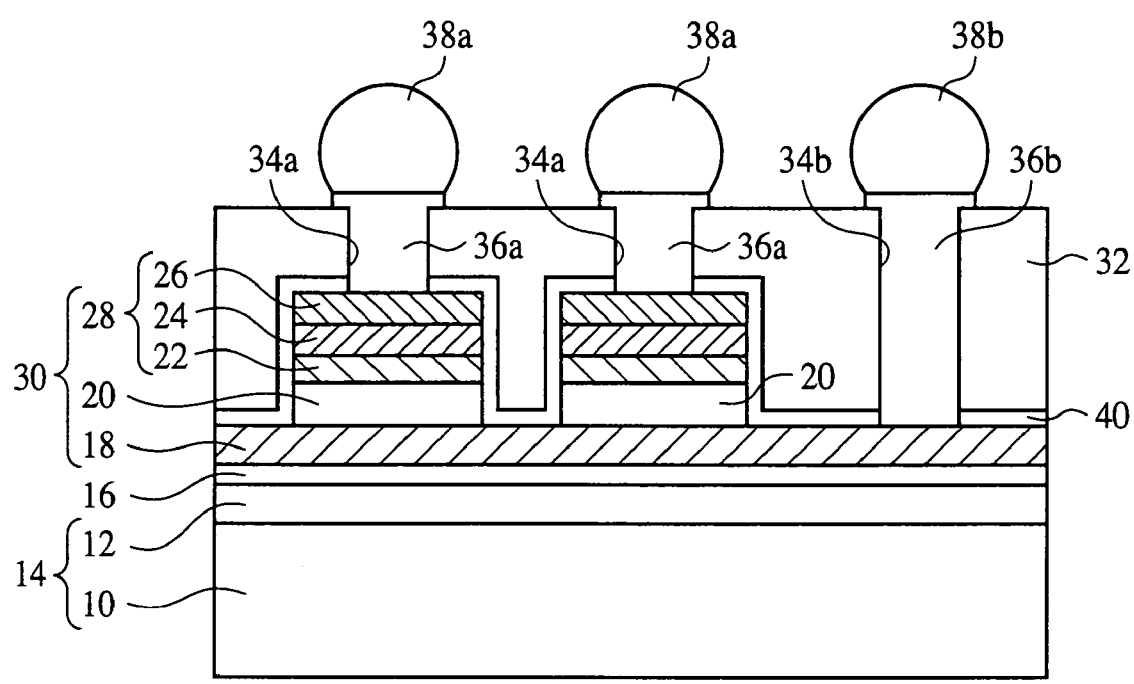
FIG. 16 is sectional views of the capacitor according to the third embodiment of the present invention in the steps of the method for fabricating the capacitor, which illustrate the method (Part 3).

The following steps of fabricating the capacitor are the same as in the method for fabricating the capacitor described above with reference to FIGS. 5B and 6, and their explanation will not be repeated (see FIGS. 15B and 16).

Thus, the capacitor according to the present embodiment is fabricated.

[A Fourth Embodiment]

Figure 17:
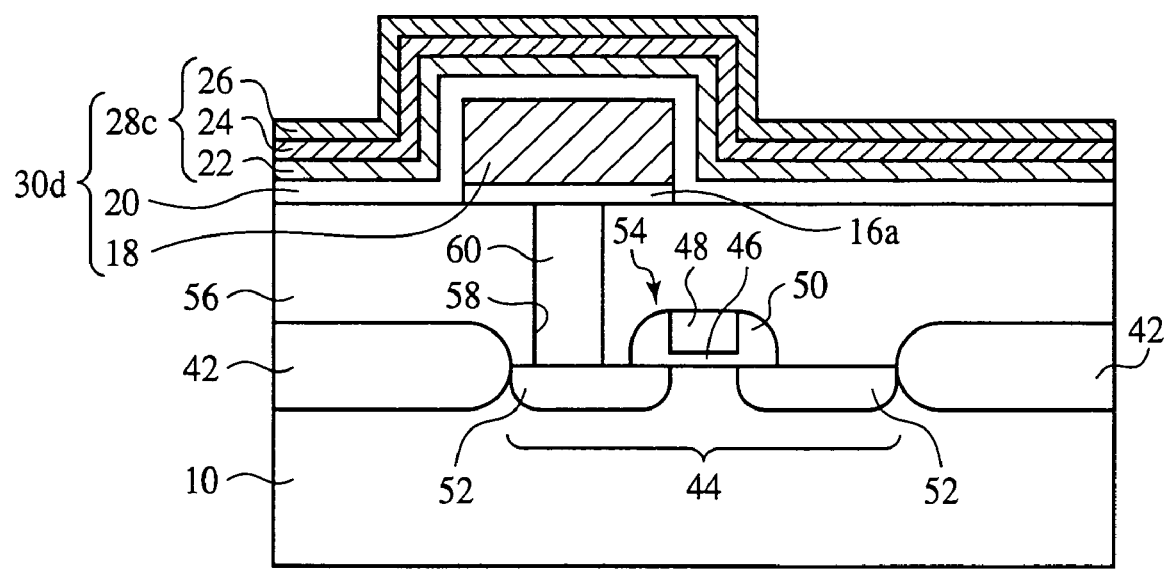
FIG. 17 is a sectional view of the semiconductor device according to a fourth embodiment of the present invention.

The semiconductor device according to a fourth embodiment of the present invention and the method for fabricating the semiconductor device will be explained with reference to FIGS. 17 to 23. FIG. 17 is a sectional view of the semiconductor device according to the present embodiment. The same members of the present embodiment as those of the capacitor according to the first to the third embodiments and the method for fabricating the capacitor are represented by the same reference numbers not to repeat or to simplify their explanation.

The semiconductor device here is exemplified by a DRAM (Dynamic Random-Access Memory), but the principle of the present invention is not applied limitedly to DRAMs but is applicable to any other semiconductor devices.

(The Semiconductor Device)

First, the semiconductor device according to the present embodiment will be explained with reference to FIG. 17.

As shown in FIG. 17, device isolation regions 42 for defining a device region is formed on a semiconductor substrate 10.

A gate insulation film 46 is formed in the device region 44 defined by the device isolation regions 42.

A gate electrode 48 is formed on the gate insulation film 46. The gate electrode 48 functions also as a word line.

A sidewall insulation film 50 is formed on the side wall of the gate electrode 48.

A source/drain diffused layer 52 is formed in the semiconductor substrate 10 on both sides of the gate electrode 48.

Thus, a transistor 54 including the gate electrode 48 and the source/drain diffused layer 52 is constituted.

An inter-layer insulation film 56 is formed on the semiconductor substrate 10 with the transistor 54 formed on. The inter-layer insulation film 56 is, e.g., silicon oxide film.

A contact hole 58 is formed in the inter-layer insulation film 56 down to the source-drain diffused layer 52.

A conductor plug 60 is buried in the contact hole 58.

An adhesion layer 16a is formed on the inter-layer insulation film 56 with the conductor plug 60 buried in. The material of the adhesion layer 16a is, e.g., Al, Cu or others.

A lower electrode 18, i.e., storage electrode is formed on the adhesion layer 16a. The material of the lower electrode 18 is, e.g., Pt.

A dielectric film 20 is formed on the inter-layer insulation film 56 with the lower electrode 18 formed on. The dielectric film 20 is high dielectric film or ferroelectric film. The dielectric film 20 here is, e.g., BST film.

A polycrystalline conduction film (a first layer) 22 is formed on the dielectric film 20. An amorphous conduction film (a second layer) 24 is formed on the polycrystalline conduction film 22. A polycrystalline conduction film (a third layer) 26 is formed on the amorphous conduction film 24. The polycrystalline conduction film 22, the amorphous conduction film 24 and the polycrystalline conduction film 26 form the upper electrode 28c.

In the present embodiment, the polycrystalline conduction film 22, the amorphous conduction film 24 and the polycrystalline conduction film 26 form the upper electrode 28c, but the upper electrode may be formed of the polycrystalline conduction film 22 and the amorphous conduction film 24.

The lower electrode 18, the dielectric film 20 and he upper electrode 28c form a capacitor 30d. The transistor 54 and the capacitor 30d form the memory cell of the DRAM.

Figure 18:
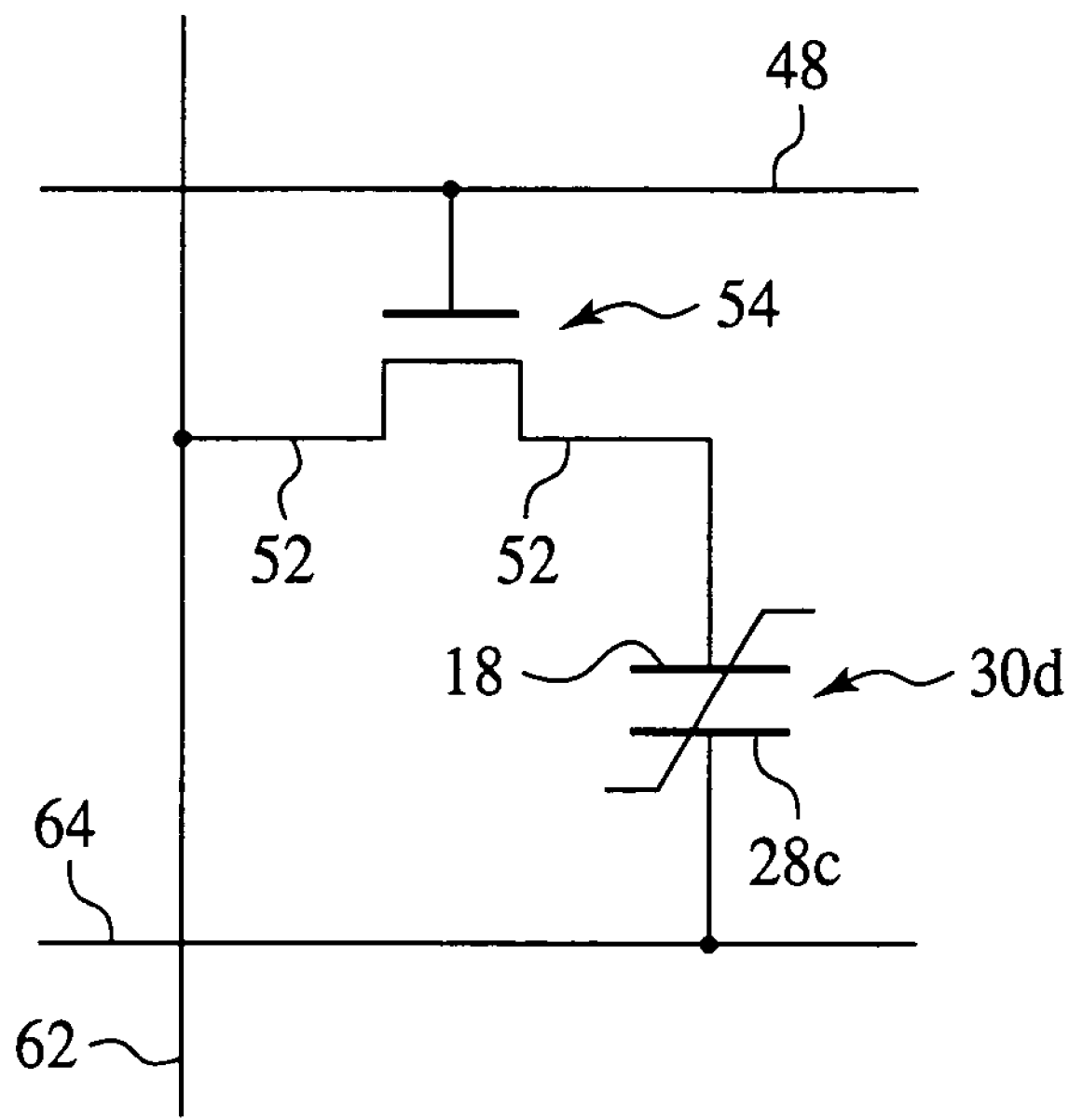
FIG. 18 is a circuit diagram of the semiconductor device according to the fourth embodiment of the present invention.

FIG. 18 is a circuit diagram of the semiconductor device according to the present embodiment.

As shown in FIG. 18, the gate electrode of the transistor 54 functions also as the word line 48. One of the source/drain 52 of the transistor 54 is connected to a bit line 62. The other of the source/drain of the transistor 54 is connected to the lower electrode 18, i.e., the storage electrode of the capacitor 30d. The upper electrode 28c, i.e., the opposed electrode of the capacitor 30d is connected to a plate line 64. The transistor 54 and the capacitor 30d form the memory cell of the DRAM.

Thus, the semiconductor device according to the present embodiment is constituted.

The semiconductor device according to the present embodiment is characterized mainly in that the upper electrode 28c of the capacitor 30d includes the amorphous conduction film 24.

According to the present embodiment, the upper electrode 28c include the amorphous conduction film 24, whereby hydrogen and water are prohibited from passing through the upper electrode 28c and arriving at the dielectric film 20. Thus, the semiconductor device according to the present embodiment can prevent the dielectric film 20 of an oxide from being reduced with hydrogen and accordingly can include the capacitor 30d having good electric characteristics.

(The Method for Fabricating the Semiconductor Device)

Then, the method for fabricating the semiconductor device according to the present embodiment will be explained with reference to FIGS. 19A to 23. FIGS. 19A to 23 are sectional views of the semiconductor device according to the present embodiment in the steps of the method for fabricating the semiconductor device, which illustrate the method.

Figure 19A:
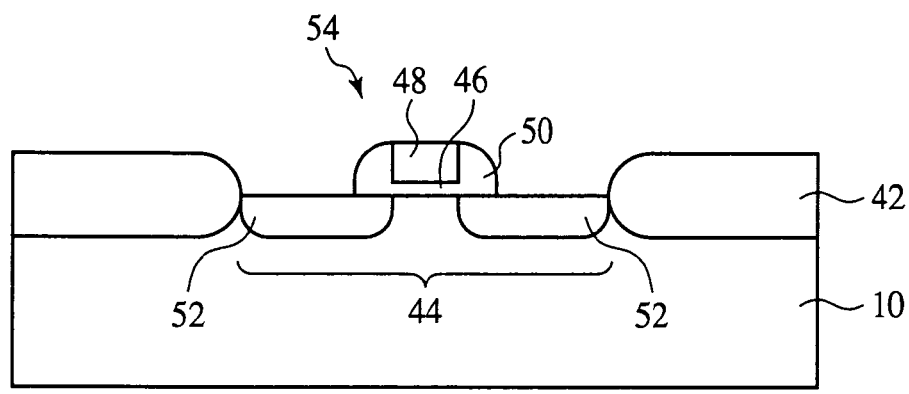
FIGS. 19A to 19C are sectional views of the semiconductor device according to the fourth embodiment of the present invention in the steps of the method for fabricating the semiconductor device, which illustrate the method (Part 1).

First, as shown in FIG. 19A, the device isolation regions 42 for defining a device region are formed on the semiconductor substrate 10. The device isolation regions 42 can be formed by, e.g., LOCOS (LOcal Oxidation of Silicon) or STI (Shallow Trench Isolation).

Next, the gate insulation film 46 is formed on the surface of the semiconductor substrate 10 by, e.g., thermal oxidation.

Then, the gate electrode 48 is formed on the gate insulation film 46. The gate electrode 48 can be formed by forming on the entire surface by, e.g., CVD (Chemical Vapor Deposition) a polysilicon film implanted with a dopant impurity and patterning the polysiliocn film in a required configuration.

Then, with the gate electrode 48 as the mask, a dopant impurity is implanted into the semiconductor substrate 10. Thus, a lightly doped diffused layer (not shown) is formed in the semiconductor substrate 10 on both sides of the gate electrode 48.

Then, a silicon oxide film is formed on the entire surface by, e.g., CVD. Then, the silicon oxide film is anisotropically etched, and the sidewall insulation film 50 of the silicon oxide film is formed on the sidewall of the gate electrode 48.

Then, with the gate electrode 48 and the sidewall insulation film 50 as the mask, a dopant impurity is implanted into the semiconductor substrate 10 on both sides of the gate electrode 48. A heavily doped diffused layer (not shown) is formed in the semiconductor substrate 10 on both sides of the gate electrode 48. The lightly doped diffused layer and the heavily doped diffused layer form the source/drain diffused layer 52. Thus, the transistor 54 including the gate electrode 48 and the source/drain diffused layer 52 is fabricated.

Figure 19B:
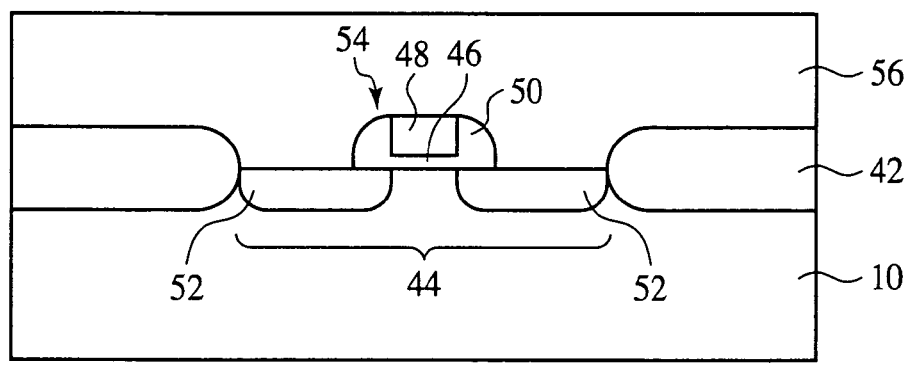

Then, as shown in FIG. 19B, the inter-layer insulation film 56 of a silicon oxide film is formed on the entire surface by, e.g., CVD.

Figure 19C:
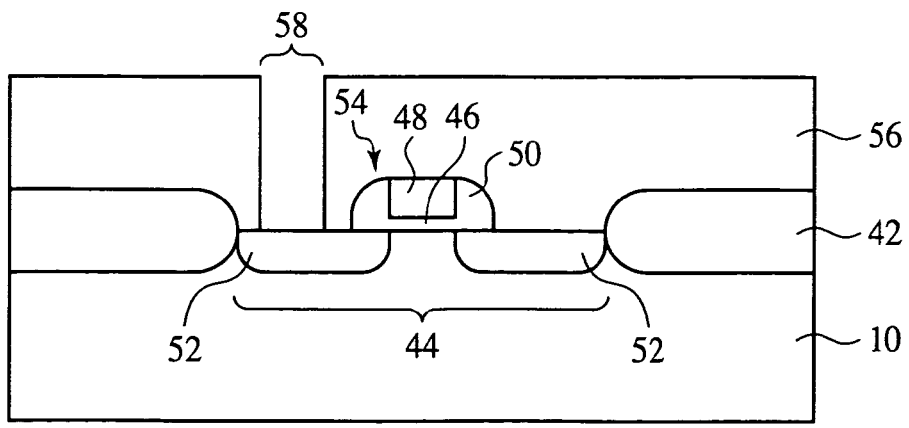

Next, as shown in FIG. 19C, the contact hole 58 is formed in the inter-layer insulation film 56 down to the source/drain diffused layer 52 by photolithography.

Then, the conduction film is formed on the entire surface. Then, the conduction film is polished by CMP (Chemical Mechanical Polishing) until the surface of the inter-layer insulation film 56 is exposed. Thus, the conductor plug 60 of the conduction film is buried in the contact hole 58 (see FIG. 20A).

Figure 20A:
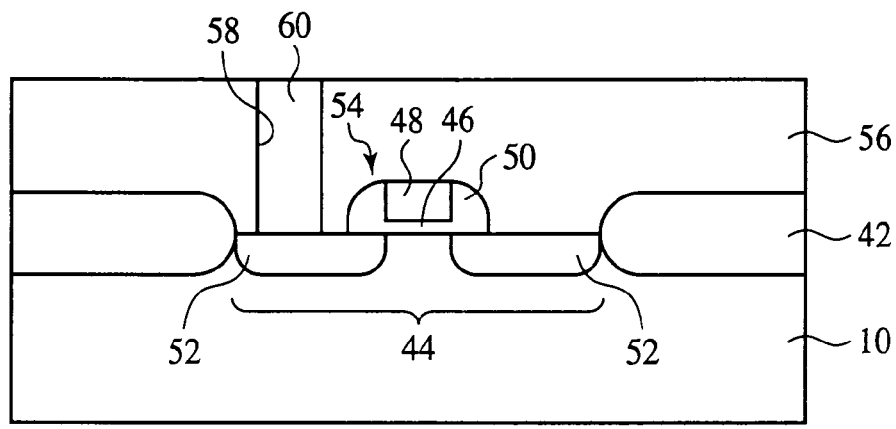
FIGS. 20A to 20C are sectional views of the semiconductor device according to the fourth embodiment of the present invention in the steps of the method for fabricating the semiconductor device, which illustrate the method (Part 2).
Figure 20B:
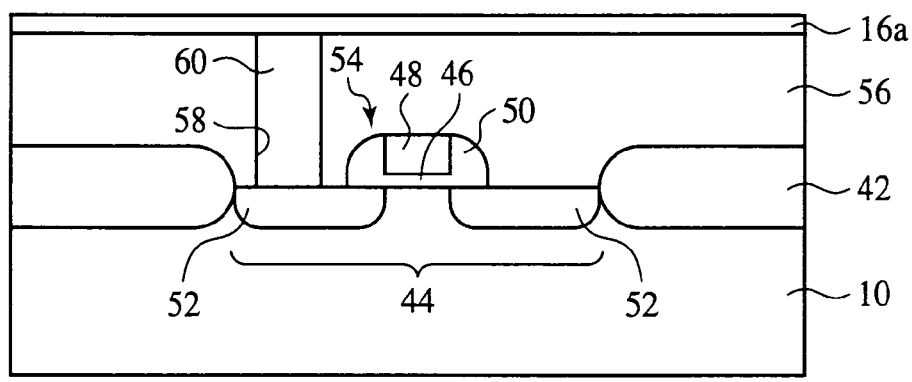

Next, as shown in FIG. 20B, the adhesion layer 16a is formed on the entire surface by, e.g., sputtering. The adhesion layer 16a is, e.g., a $TiO_2$ layer.

Figure 20C:
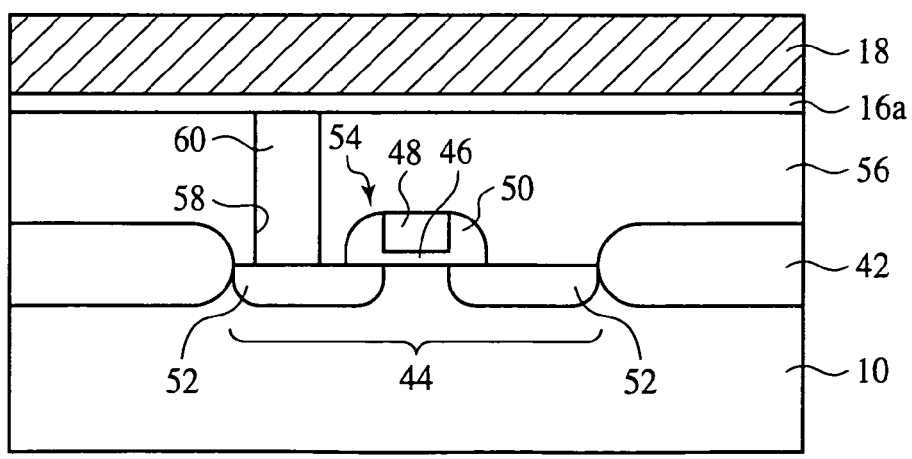

Next, as shown in FIG. 20C, the conduction film 18 is formed on the entire surface by, e.g., sputtering. The conduction film 18 is to be the lower electrode, i.e., the storage electrode. The film thickness of the conduction film 18 is, e.g., about 100 nm.

Figure 21A:
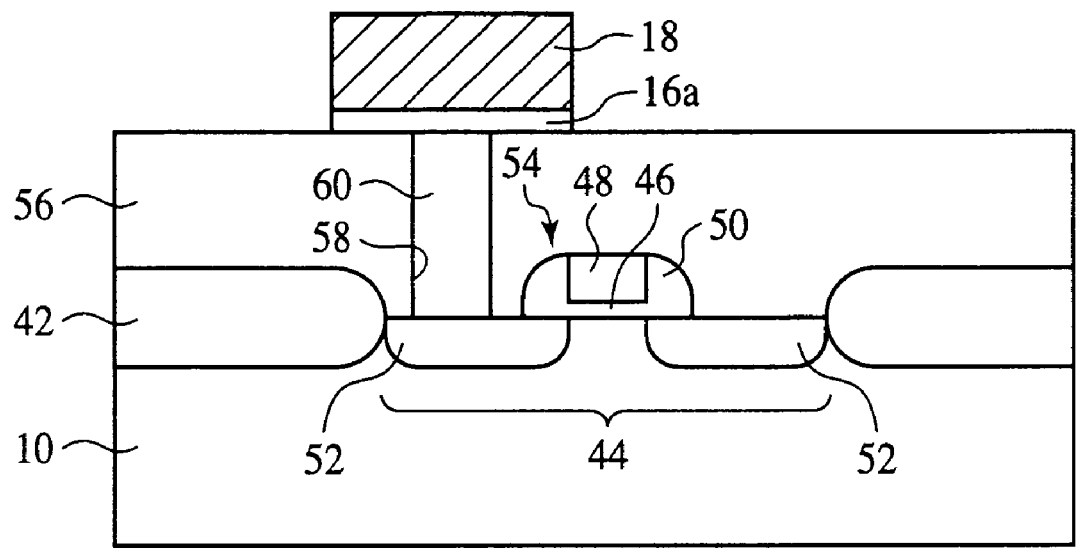
FIGS. 21A and 21b are sectional views of the semiconductor device according to the fourth embodiment of the present invention in the steps of the method for fabricating the semiconductor device, which illustrate the method (Part 3).

Then, as shown in FIG. 21A, the adhesion layer 16a and the conduction film 18 are patterned by photolithography, and the lower electrode 18 of the conduction film is formed.

Figure 21B:
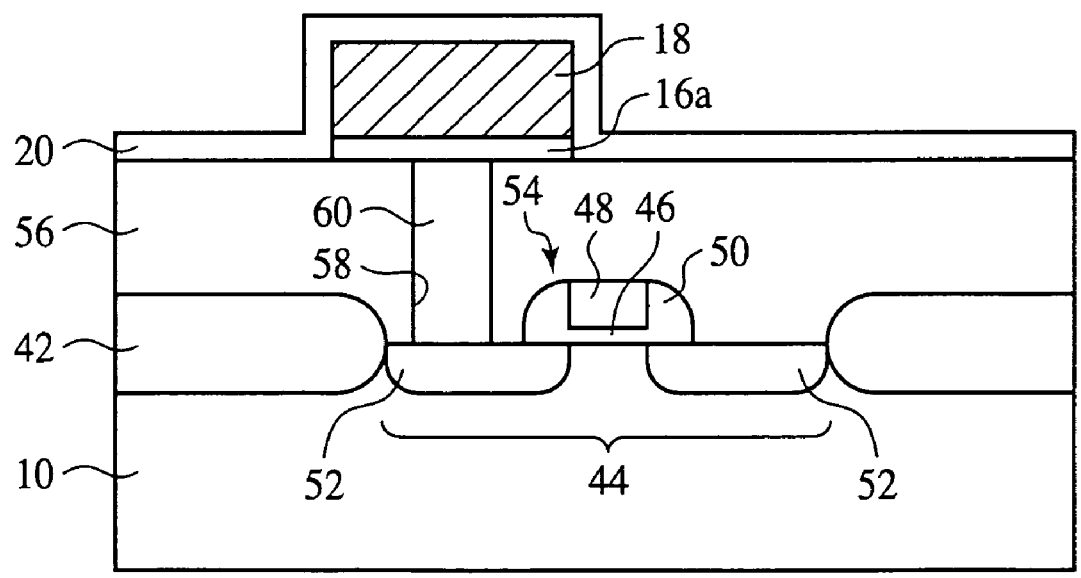

Next, as shown in FIG. 21B, the dielectric film 20 is formed on the entire surface. The dielectric film 20 is formed in the same way as in the method for fabricating the capacitor described above with reference to FIG. 3A.

Figure 22A:
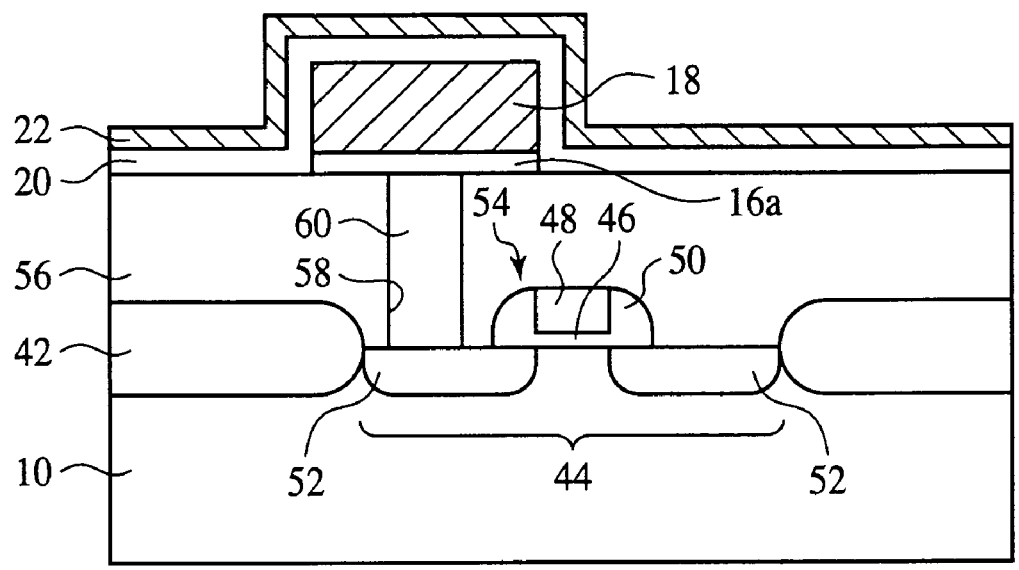
FIGS. 22A and 22B are sectional views of the semiconductor device according to the fourth embodiment of the present invention in the steps of the method for fabricating the semiconductor device, which illustrate the method (Part 4).

Next, as shown in FIG. 22A, the polycrystalline conduction film 22 is formed on the entire surface of the dielectric film 20. The polycrystalline conduction film 22 is formed in the same way as in the method for fabricating the capacitor described above with reference to FIG. 3B.

Figure 22B:
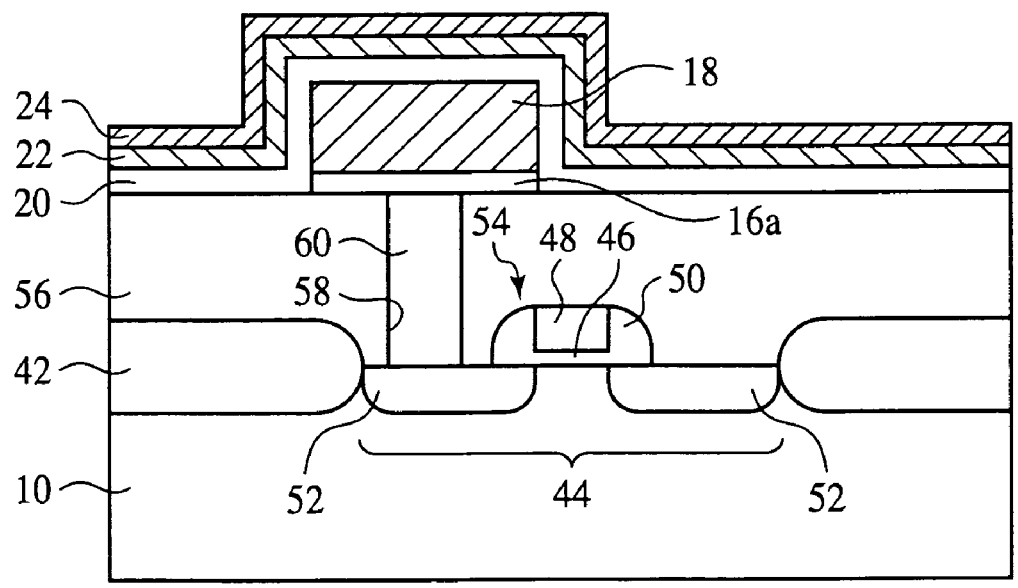

Next, as shown in FIG. 22B, the amorphous conduction film 24 is formed on the entire surface of the polycrystalline conduction film 22. The amorphous conduction film 24 is formed in the same way as in the method for fabricating the capacitor described above with reference to FIG. 3C.

Figure 23:
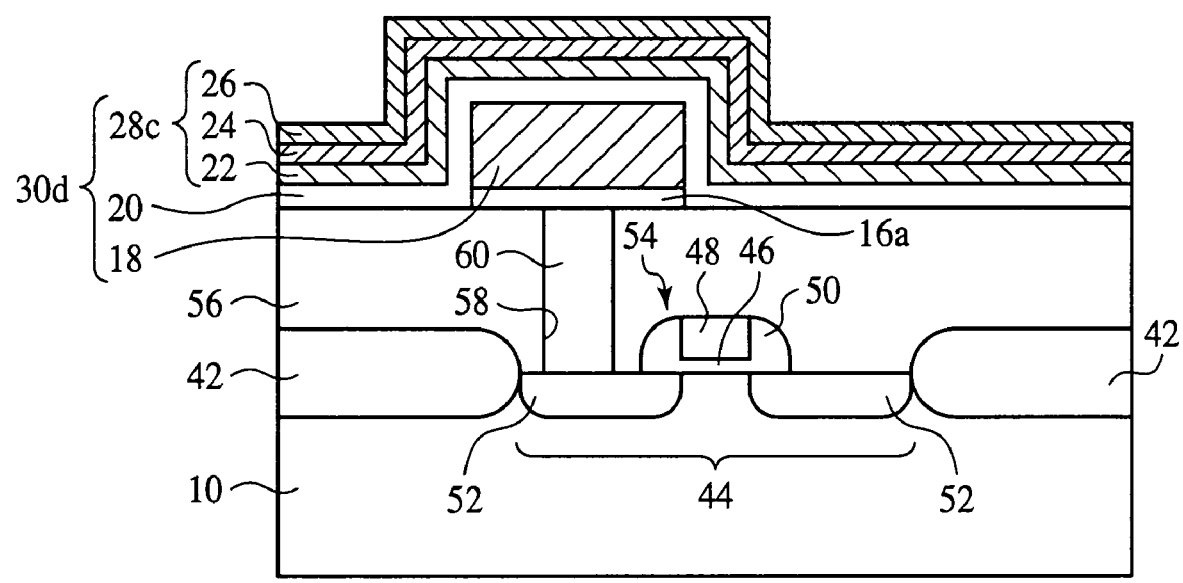
FIG. 23 is sectional views of the semiconductor device according to the fourth embodiment of the present invention in the steps of the method for fabricating the semiconductor device, which illustrate the method (Part 5).

Then, as shown in FIG. 23, the polycrystalline conduction film 26 is formed on the entire surface of the amorphous conduction film 24. The polycrystalline conduction film 26 is formed in the same way as in the method for fabricating the capacitor described above with reference to FIG. 4A. The polycrystalline conduction film 22, the amorphous conduction film 24 and the polycrystalline conduction film 26 form the upper electrode 28c. The lower electrode 18, the electric film 20 and the upper electrode 28c form the capacitor 30d.

Thus, the semiconductor device according to the present embodiment is fabricated.

[Modified Embodiments]

The present invention is not limited to the above-described embodiments and can cover other various modifications.

For example, in the above-described embodiments, the amorphous conduction film 24 is formed of $Ta_xSi_yN_z$. However, the material of the amorphous conduction film is not limited to $Ta_xSi_yN_z$, and any other material may be suitably used. For example, as the amorphous conduction film 24, $Ta_xSi_yN_z$ film or others may be used. As the amorphous conduction film 24, $PtO_X$ film, $IrO_X$ film or others may be used. As the amorphous conduction film 24, impurity implanted silicon film, i.e., impurity doped amorphous silicon film may be used.

As the amorphous conduction film 24, $SrTiO_3$ film with an impurity (donor) implanted in, $BaTiO_3$ with an impurity (donor) implanted in or other may be used. In this case, the impurity can be, e.g., Nb or others.

In the above-described embodiments, the substrate 10 is a semiconductor substrate. However, the material of the substrate 10 is not limited to semiconductors, and a substrate of any other material can be suitably used.

In the above-described embodiments, a silicon substrate is used as the semiconductor substrate 10. However, the semiconductor substrate 10 is not limited to a silicon substrate, and a semiconductor substrate of another material can be suitably used. For example, a Ge substrate, a SiGe substrate or others may be used. A substrate of a III–V group semiconductor may be used. As the substrate of a III–V group semiconductor, a GaAs substrate, InAs substrate, InP substrate or others, for example, can be used.

In the above-described embodiments, as the adhesion layer 16, $TiO_X$ layer is used. However, the material of the adhesion layer 16 is not limited to $TiO_X$, and any other material can be suitably used. For example, as the adhesion layer 16, Pt, Ir, Zr, Ti, $TiO_X$, $IrO_X$, $PtO_X$, $ZrO_X$, TiN, TiAlN, TaN, TaSiN or others may be used. A combination, a multilayer or a mixture of them can be used as the adhesion layer 16.

As the adhesion layer 16, a noble metal, a noble metal alloy, an alloy of a noble metal and a base metal, a conducting noble metal oxide, an insulating metal oxide, an insulating metal nitride, a conducting metal nitride or others may be used. A combination, a multilayer or a mixture of them may be used as the adhesion layer 16.

In the above-described embodiments, the material of the lower electrode 18 is Pt. However, the material of the lower electrode 18 is not limited to Pt, and any other material can be suitably used. For example, as the lower electrode 18, Pt, Pd, Ir, Ru, Rh, Re, Os, $PtO_X$, $IrO_X$, $RuO_X$, Au, Ag, Cu or others can be used. A combination, a multilayer or a mixture of them may be used as the lower electrode 18.

As the lower electrode 18, a transition metal, a noble metal a noble metal alloy, an alloy of a noble metal and a base metal or a conducting noble metal oxide may be used. A combination, a multilayer or a mixture of them may be used as the lower electrode 18.

In the above-described embodiments, as the dielectric film 20, BST film is used. The material of the dielectric film 20 is not limited to BST, and any other dielectric film can be suitably used. For example, a dielectric of a perovskite structure oxide, a dielectric of a pyrochlore structure oxide, or others may be used as the dielectric film 20. The pyrochlore structure oxide is an oxide expressed by the basic formula $A_2B_2O_X$ wherein the composition ratio X is about 6–7. Specific pyrochlore structure oxide is, e.g., $Pb_2(Zr,Ti)_2O_7$, etc.

As the dielectric film 20, an oxide containing a titanate as the main component, an oxide containing a manganate as the main component, a copper oxide, a niobium oxide having tungsten bronze structure, a tantalate having tungsten bronze structure, a titanate having tungsten bronze structure, a tantalate having bismuth layer structure, a niobate having bismuth layer structure, a titanate having bismuth layer structure or others can be used. The tungsten bronze structure is a crystal structure having $ABO_3$ (x<1) as the basic crystal structure, which is perovskite structure, $ABO_3$, having a part of A site ions missed. The bismuth layer structure is a crystal structure having perovskite structure and $Bi_2O_3$ laid one on the other.

As the dielectric film 20, a perovskite structure oxide $ABO_3$ wherein A is cations having 1–3 positive charges, and B is a IVB group element, a VB group element, a VIB group element, a VIIB group element, a IB group element or others may be used.

As the dielectric film 20, barium titanate, strontium titanate, barium strontium titanate, a tantalum oxide, potassium tantalum oxide, bismuth titanate, strontium bismuth tantalate, strontium bismuth niobate, strontium bismuth tantalum niobate, lead zirconium titanate, lead lanthanum zirconium titanate, lead magnesium niobate or others may be used. Any one of them with an impurity implanted may be suitably used.

In the above-described embodiments, as the polycrystalline conduction film 22 is Pt film or others. However, the material of the polycrystalline conduction film 22 is not limited to Pt, and any other material can be suitably used. For example, as the polycrystalline conduction film 22, Pt, Pd, Ir, Ru, Rh, Re, $PtO_X$, $IrO_X$, $RuO_X$, Au, Ag or Cu can be used. A combination, a multilayer or a mixture of them may be used as the polycrystalline conduction film 22.

As the polycrystalline conduction film 22, a transition metal, a noble metal, a noble metal alloy, an alloy of a noble metal and a base metal, a conducting oxide or others maybe used. A combination, a multilayer or a mixture of them may be used as the polycrystalline conduction film 22.

In the above-described embodiments, the polycrystalline conduction film 26 is Au film or others. However, the material of the polycrystalline conduction film 26 is not limited to Au or others, and any other material can be suitably used. For example, as the polycrystalline conduction film 26, Pt, Pd, Ir, Ru, Rh, Re, Au, Ag, Cu or others can be used. A combination, a multilayer or a mixture of them may be used as the polycrystalline conduction film 26.

As the polycrystalline conduction film 26, a transition metal, a noble metal, a noble metal alloy, an alloy of a noble metal and a base metal or others may be used. A combination, a multilayer or a mixture of them may be used as the polycrystalline conduction film 26.

In the above-described embodiments, silicon oxide film is used as the insulation film 12. However the insulation film 12 is not limited to silicon oxide film, and any other material can be suitably used. For example, as the material of the insulation film 12, an oxide, a nitride, an oxide nitride, a high dielectric of a metal oxide, a dried gel or others can be used. The high dielectric means a dielectric whose relative dielectric constant is higher than the dielectric constant of silicon. A combination, a multilayer or a mixture of them may be used as the insulation film 12.

In the fourth embodiment, the source/drain diffused layer 52 of the transistor 54 is connected to the lower electrode 18 of the capacitor 30d but may be electrically connected to the upper electrode of the capacitor.

What is claimed is:

1. A capacitor comprising:
   a lower electrode formed on a base substrate;
   a dielectric film formed on the lower electrode;
   an upper electrode formed on the dielectric film and including a polycrystalline conduction film and an amorphous conducting non-oxide film formed on the polycrystalline conduction film.

2. A capacitor according to claim 1, wherein the upper electrode further includes another polycrystalline conducting non-oxide film formed on the amorphous conduction film.

3. A capacitor according to claim 1, further comprising an amorphous insulation film formed, covering at least a side wall of the dielectric film.

4. A capacitor according to claim 1, wherein the amorphous conducting non-oxide film is formed of $Ti_xSi_yN_z$ or $Ta_xSi_yN_z$.

5. A capacitor according to claim 1, wherein the amorphous conducting non-oxide film is formed of silicon with an impurity implanted in.

6. A capacitor according to claim 1, wherein the base substrate includes a semiconductor substrate.

7. A capacitor according to claim 6, wherein the base substrate includes the semiconductor substrate, and an insulation layer formed on the semiconductor substrate.

8. A capacitor according to claim 7, wherein the insulation layer is formed of an oxide, a nitride, an oxide nitride, a high dielectric of a metal oxide or a dried gel.

9. A capacitor according to claim 6, wherein the semiconductor substrate is formed of Si, Ge or SiGe.

10. A capacitor according to claim 6, wherein the semiconductor substrate is formed of a III–V group semiconductor.

11. A capacitor according to claim 10, wherein the semiconductor substrate is formed of GaAs, InAs or InP.

12. A capacitor according to claim 1, further comprising an adhesion layer formed between the base substrate and the lower electrode.

13. A capacitor according to claim 1, wherein the dielectric film is formed of a high dielectric substance or a ferroelectric substance.

14. A capacitor according to claim 13, wherein the dielectric film is formed of a perovskite structure oxide or a pyrochlore structure oxide.

15. A capacitor according to claim 13, wherein the dielectric film is formed of an oxide containing a titanate as a main component, an oxide containing a manganate as a main component, copper oxide, a niobium oxide having tungsten bronze structure, a tantalate having tungsten bronze structure, a titanate having tungsten bronze structure, a tantalate having bismuth layer structure, a niobate having bismuth layer structure or a titanate having bismuth layer structure.

16. A capacitor according to claim 13, wherein the dielectric film is a perovskite structure oxide expressed by $ABO_3$ wherein A is a cation having 1–3 positive charges, and B is a IVB group element, a VB group element, a VIB group element, a VIIB group element or a I.B group element.

17. A capacitor according to claim 13, wherein the dielectric film is formed of barium titanate, strontium titanate, barium strontium titanate, a tantalum oxide, potassium tantalum oxide, bismuth titanate, strontium bismuth tantalate, strontium bismuth niobate, strontium bismuth tantalum niobate, lead zirxonium titanate, lead lanthanum zirconium titanate or lead magnesium niobate.

18. A capacitor according to claim 1, wherein the polycrystalline conduction film is formed of Pt, Pd, Ir, Ru, Rh, Re, $PtO_X$, $IrO_X$, $RuO_X$, Au, Ag or Cu.

19. A capacitor according to claim 1, wherein the polycrystalline conduction film is formed of a transition metal, a noble metal, a noble metal ally, an alloy of a noble metal and a base metal or a conducting oxide.

20. A capacitor according to claim 2, wherein said another polycrystalline conduction film is formed of Pt, Pd, Ir, Ru, Rh, Re, Au, Ag or Cu.

21. A capacitor according to claim 2, wherein said another polycrystalline conduction film is formed of a transition metal, a noble metal, a noble metal alloy or an alloy of a noble metal and a base metal.

22. A semiconductor device comprising a capacitor formed on a semiconductor substrate,
   the capacitor including a lower electrode; a dielectric film formed on the lower electrode; and an upper electrode including a polycrystalline conduction film formed on the dielectric film and an amorphous conducting non-oxide film formed on the polycrystalline conduction film.

* * * * *